(12) United States Patent
Hopkins et al.

(10) Patent No.: US 12,648,137 B2
(45) Date of Patent: Jun. 2, 2026

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 18/784,152

(22) Filed: Jul. 25, 2024

(65) Prior Publication Data

US 2024/0381638 A1    Nov. 14, 2024

Related U.S. Application Data

(63) Continuation of application No. 17/674,289, filed on Feb. 17, 2022, now Pat. No. 12,082,409.

(51) Int. Cl.
*G11C 11/34*        (2006.01)
*H10B 41/10*        (2023.01)
(Continued)

(52) U.S. Cl.
CPC ............. *H10B 43/10* (2023.02); *H10B 41/10* (2023.02); *H10B 41/27* (2023.02); *H10B 43/27* (2023.02);
(Continued)

(58) Field of Classification Search
CPC ........ H10B 43/10; H10B 41/10; H10B 41/27; H10B 43/27; H10B 43/35; H10B 41/35; G11C 16/0483
(Continued)

(56) References Cited

U.S. PATENT DOCUMENTS

| 10,388,665 B1 * | 8/2019 | Xie | ................... | H01L 21/02595 |
| 10,707,163 B2 * | 7/2020 | Lau | ........................ | H10D 89/10 |

(Continued)

*Primary Examiner* — Viet Q Nguyen
(74) *Attorney, Agent, or Firm* — Wells St. John P.S.

(57)        ABSTRACT

A method used in forming a memory array comprising strings of memory cells comprises forming a stack comprising vertically-alternating insulative tiers and conductive tiers having channel-material strings therein. Walls are formed above insulating material that is directly above the channel-material strings. Void space is laterally-between immediately-adjacent of the walls and that comprises a longitudinal outline of individual digitlines to be formed. Spaced openings are in the insulating material directly below the void space. Relative to the walls, a conductive metal nitride is selectively deposited in the void space, in the spaced openings, and atop the insulating material laterally-between the walls and the spaced openings to form a lower portion of the individual digitlines laterally-between the immediately-adjacent walls. The conductive metal nitride that is in individual of the spaced openings is directly electrically coupled to individual of the channel-material strings. A conductive material is formed in the void space directly above and directly electrically coupled to the lower portion of the individual digitlines to form an upper portion thereof. Other embodiments, including structure independent of method, are disclosed.

24 Claims, 21 Drawing Sheets

(51) Int. Cl.

| | |
|---|---|
| *H10B 41/27* | (2023.01) |
| *H10B 43/10* | (2023.01) |
| *H10B 43/27* | (2023.01) |
| *G11C 16/04* | (2006.01) |
| *H10B 41/35* | (2023.01) |
| *H10B 43/35* | (2023.01) |

(52) U.S. Cl.
CPC .......... *G11C 16/0483* (2013.01); *H10B 41/35* (2023.02); *H10B 43/35* (2023.02)

(58) Field of Classification Search
USPC .................................................... 365/185.11
See application file for complete search history.

(56) References Cited

U.S. PATENT DOCUMENTS

| | | | | |
|---|---|---|---|---|
| 11,362,142 | B2 * | 6/2022 | Hu ...................... | H10D 84/038 |
| 11,444,099 | B2 * | 9/2022 | Chandolu .............. | H10B 43/27 |
| 11,563,022 | B2 * | 1/2023 | Xu ......................... | H10B 43/27 |
| 11,744,069 | B2 | 8/2023 | Hopkins et al. | |
| 2020/0091071 | A1 | 3/2020 | Lee et al. | |
| 2021/0202324 | A1 | 7/2021 | Scarbrough et al. | |
| 2022/0068944 | A1 * | 3/2022 | Hopkins ................ | H10B 41/27 |
| 2022/0068955 | A1 * | 3/2022 | King .................... | H10B 43/10 |
| 2022/0109001 | A1 * | 4/2022 | Luo ....................... | H01L 23/562 |
| 2022/0238548 | A1 * | 7/2022 | Liu ........................ | H10B 43/27 |
| 2022/0336485 | A1 * | 10/2022 | Howder ................. | H10B 43/27 |
| 2023/0067814 | A1 * | 3/2023 | Manthena ......... | H01L 21/76877 |
| 2023/0209831 | A1 * | 6/2023 | Hopkins ............... | H10B 43/35 |
| | | | | 257/288 |
| 2023/0255023 | A1 * | 8/2023 | Xu ......................... | H01L 21/70 |
| | | | | 257/314 |

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
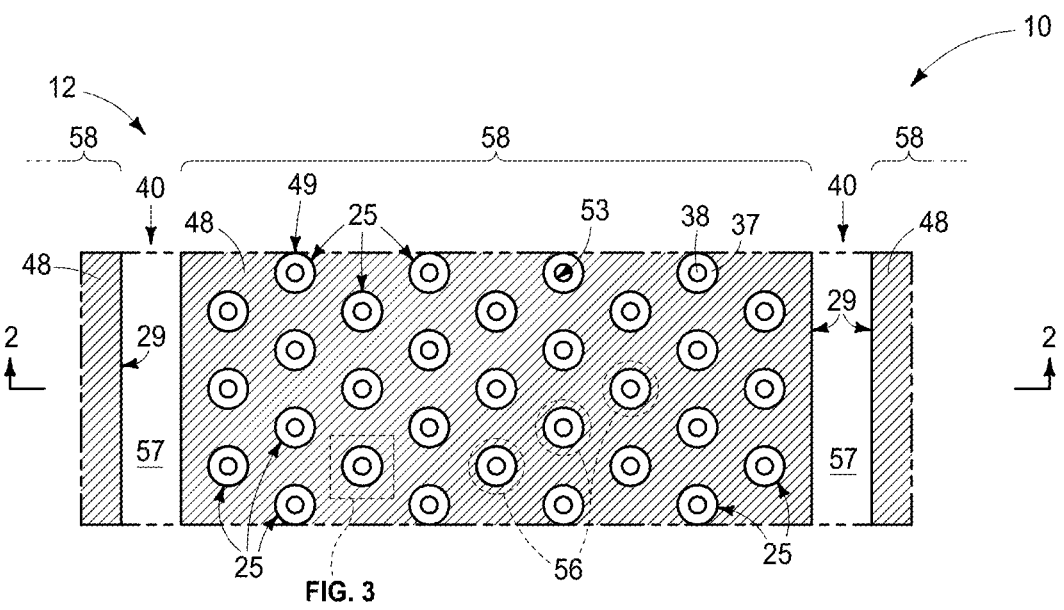
FIG. 1 is a diagrammatic cross-sectional view of a portion of a substrate in process in accordance with an embodiment of the invention and is taken through line 1-1 in FIG. 2.
Figure 2:
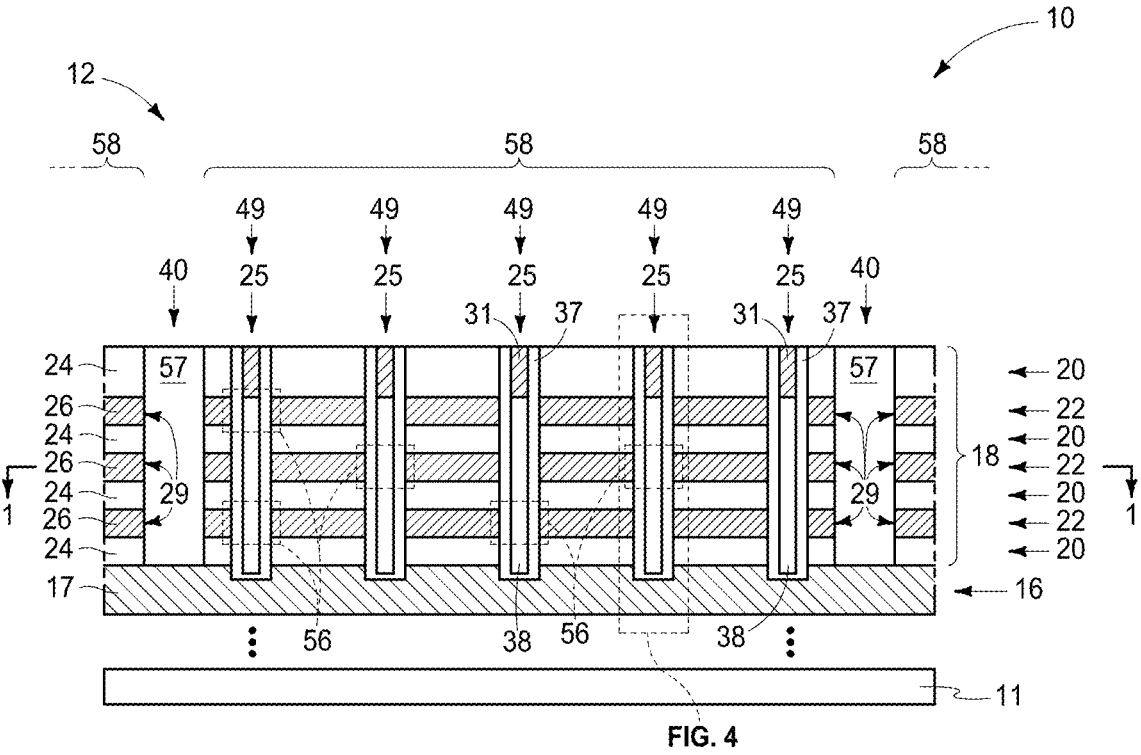
FIG. 2 is a diagrammatic cross-sectional view taken through line 2-2 in FIG. 1.
Figures 3, 4, 5:
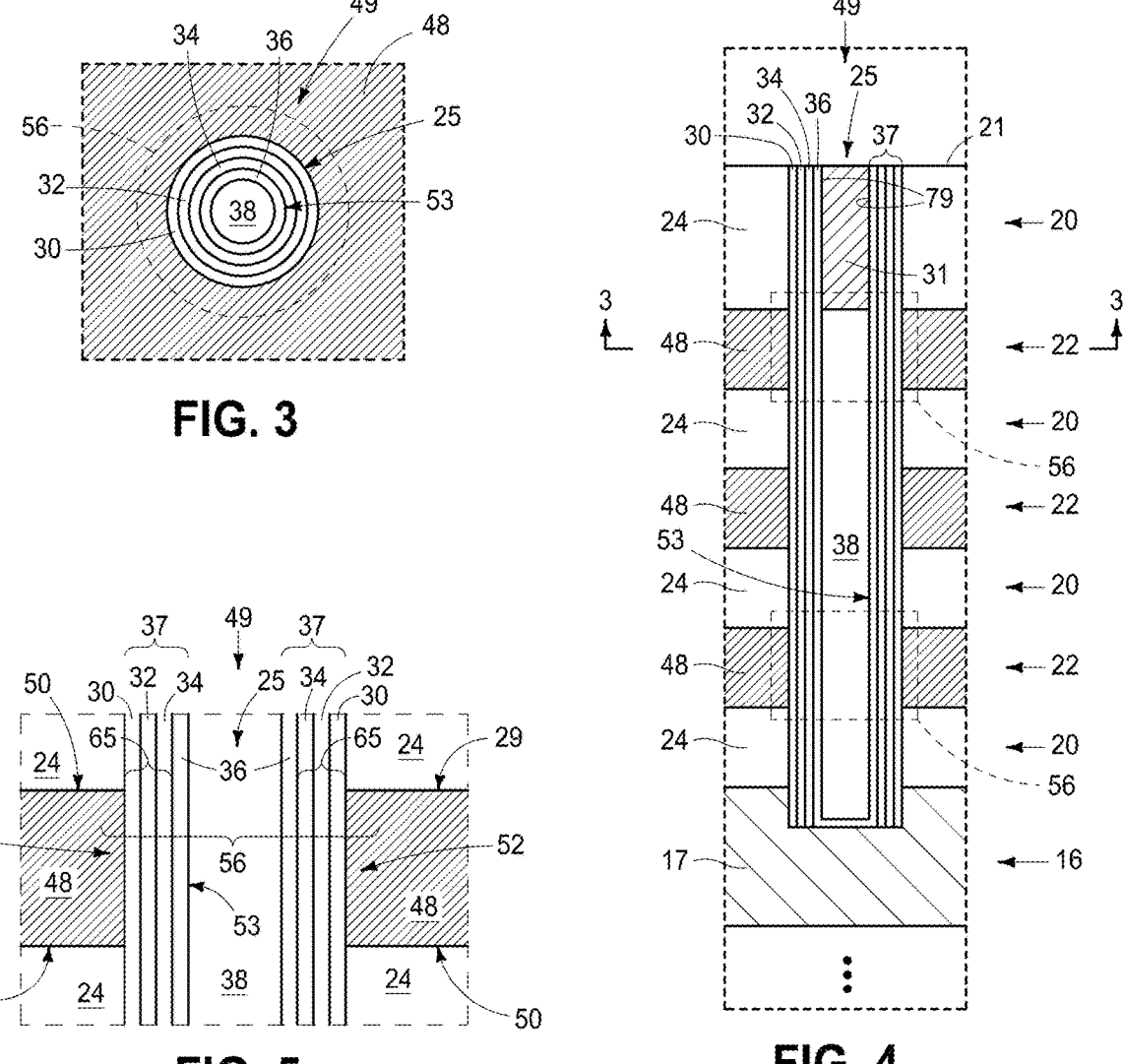
FIGS. 3-5 are enlarged views of portions of FIGS. 1 and 2.

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-36.

FIGS. 1-5 show an example construction 10 having an array 12 in which strings 49 of transistors and/or memory cells 56 have been formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 20 to 60 nanometers. The example uppermost tier 20 may be thicker/ thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Example memory blocks 58 are shown as at least in part having been defined by horizontally-elongated trenches 40 that were formed (e.g., by anisotropic etching) into stack 18. Trenches 40 may have respective bottoms that are directly against conductor material 17 (e.g., atop or within) of conductor tier 16 (as shown) or may have respective bottoms that are above conductor material 17 of conductor tier 16 (not shown). Intervening material 57 is in trenches 40 in stack 18 and may provide lateral electrical isolation (insulation) between immediately-laterally-adjacent memory blocks 58. Such may include one or more of insulative, semiconductive, and conducting materials and, regardless, may facilitate conductive tiers 22 from shorting relative to one another in a finished circuitry construction. Example insulative materials are one or more of $SiO_2$, $Si_3N_4$, and $Al_2O_3$. Intervening material 57 may include through array vias (TAVs) and not shown.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18.

Channel material 36 has also been formed in channel openings 25 elevationally along insulative tiers 20 and conductive tiers 22 and comprises individual channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment, conducting material 31 (e.g., a conductive plug/via comprising conductively-doped polysilicon) is directly against laterally-inner sides 79 in an upper portion of individual channel-material strings 53. One or more of materials 30, 32, 34, and 36 may not extend to the top of conducting material 31 (not shown).

Further, and regardless, conducting material 31 may not extend to the top of stack 18 (not shown), may extend above stack 18 (not shown), and/or may extend below the bottom of uppermost tier 20 (not shown).

Example conductive tiers 22 comprise conducting material 48 that is part of individual conductive lines 29 (e.g., wordlines) that are also part of strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally-between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 6:
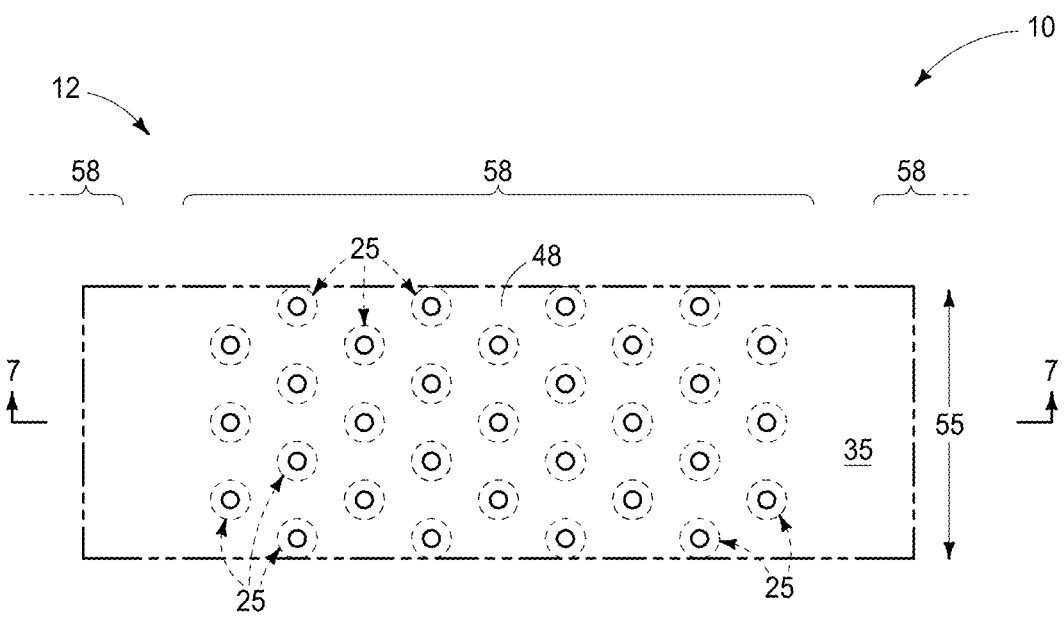
FIGS. 6-36 are diagrammatic sequential sectional, expanded, enlarged, and/or partial views of the construction of FIGS. 1-5, or portions thereof, in process in accordance with some embodiments of the invention.
Figure 7:
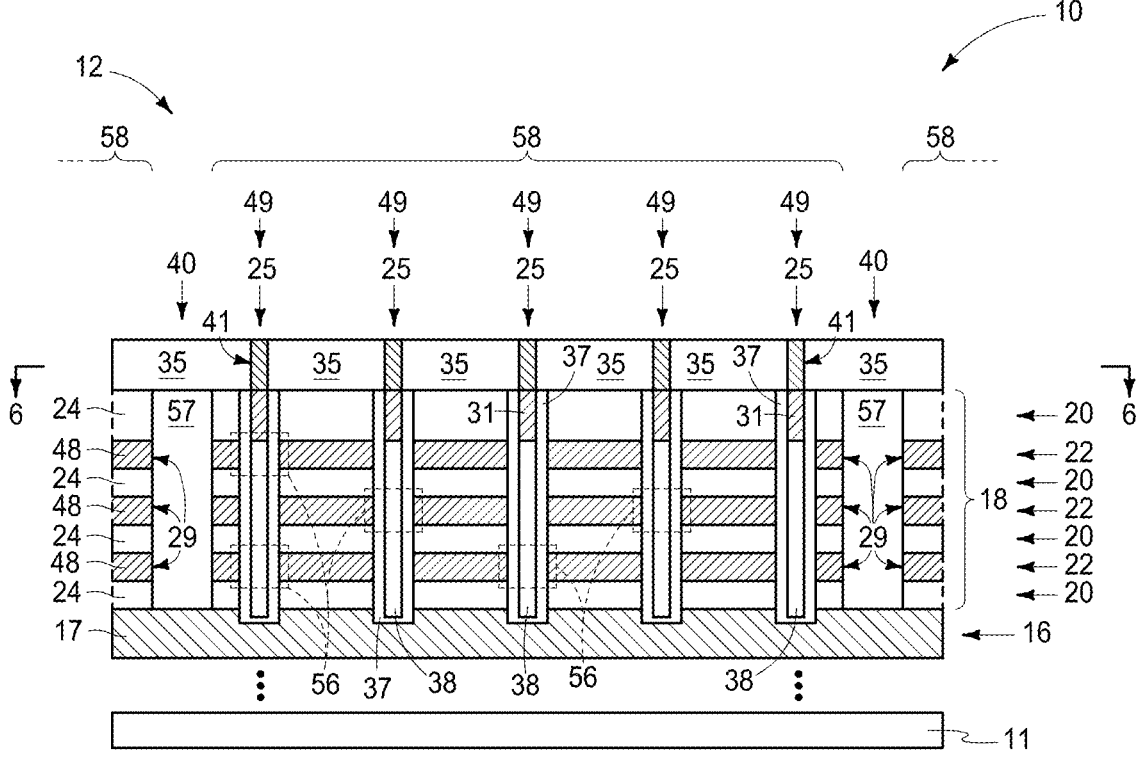

Referring to FIGS. 6 and 7, conductive vias 41 (e.g., comprising conductive metal material and/or conductively-doped polysilicon) have been formed above and individually electrically coupled to (e.g., directly electrically coupled to) individual channel-material strings 53 (e.g., through conducting material 31). Conductive vias 41 may taper laterally inward or laterally outward in the vertical cross-section that is FIG. 7 (not shown). By way of example only and for convenience, conductive vias 41 are shown as being of the same horizontal size as, the same horizontal shape as, and perfectly aligned with individual conducting material/plugs 31. Insulating material 35 (e.g., silicon dioxide and/or silicon nitride) is laterally-between immediately-adjacent conductive vias 41.

Figure 8:
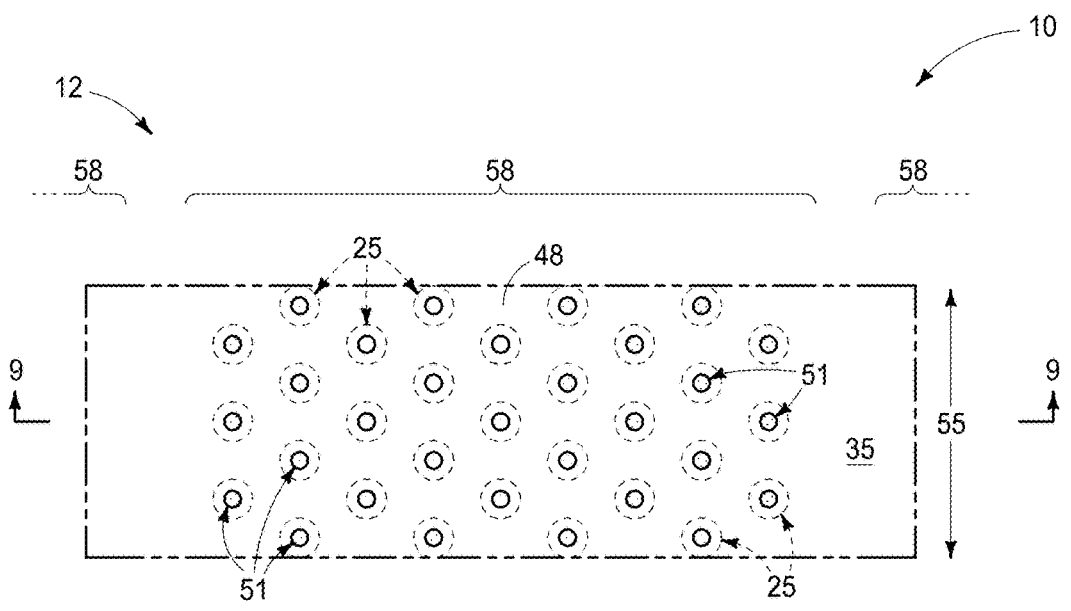
Figure 9:
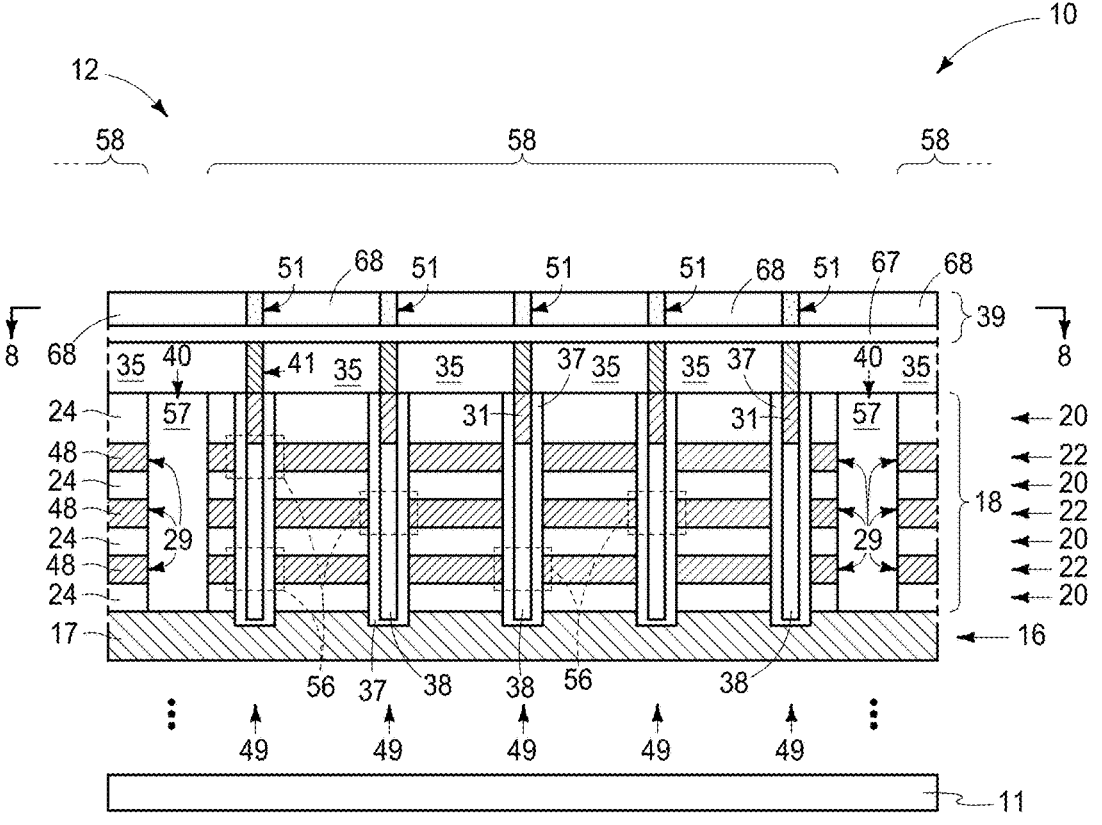
Figure 10:
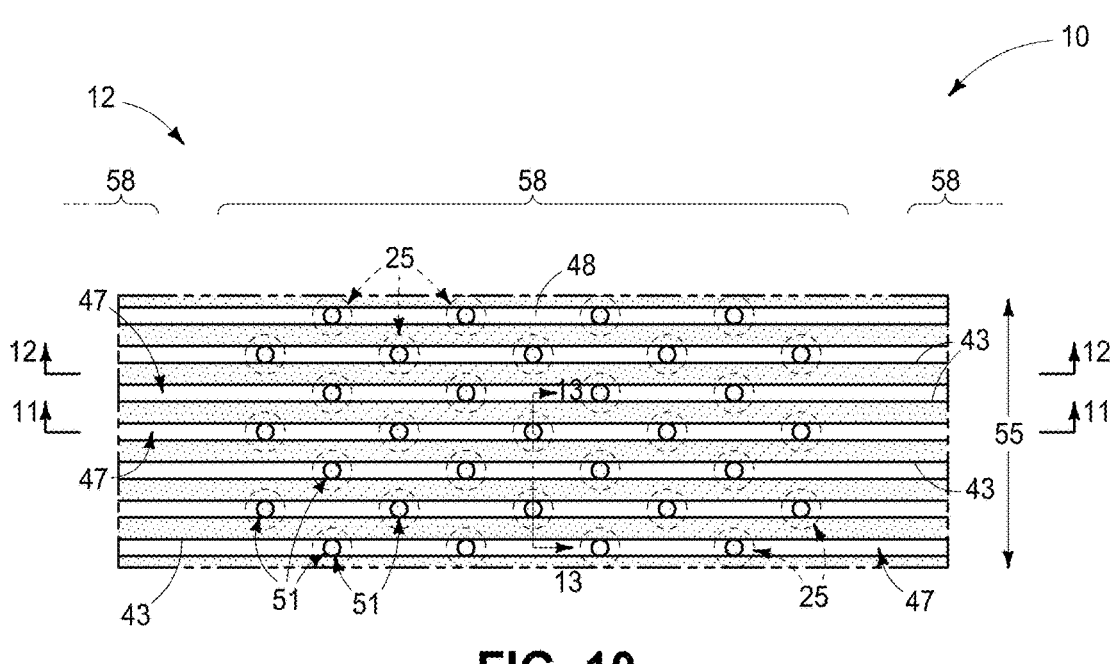
Figure 11:
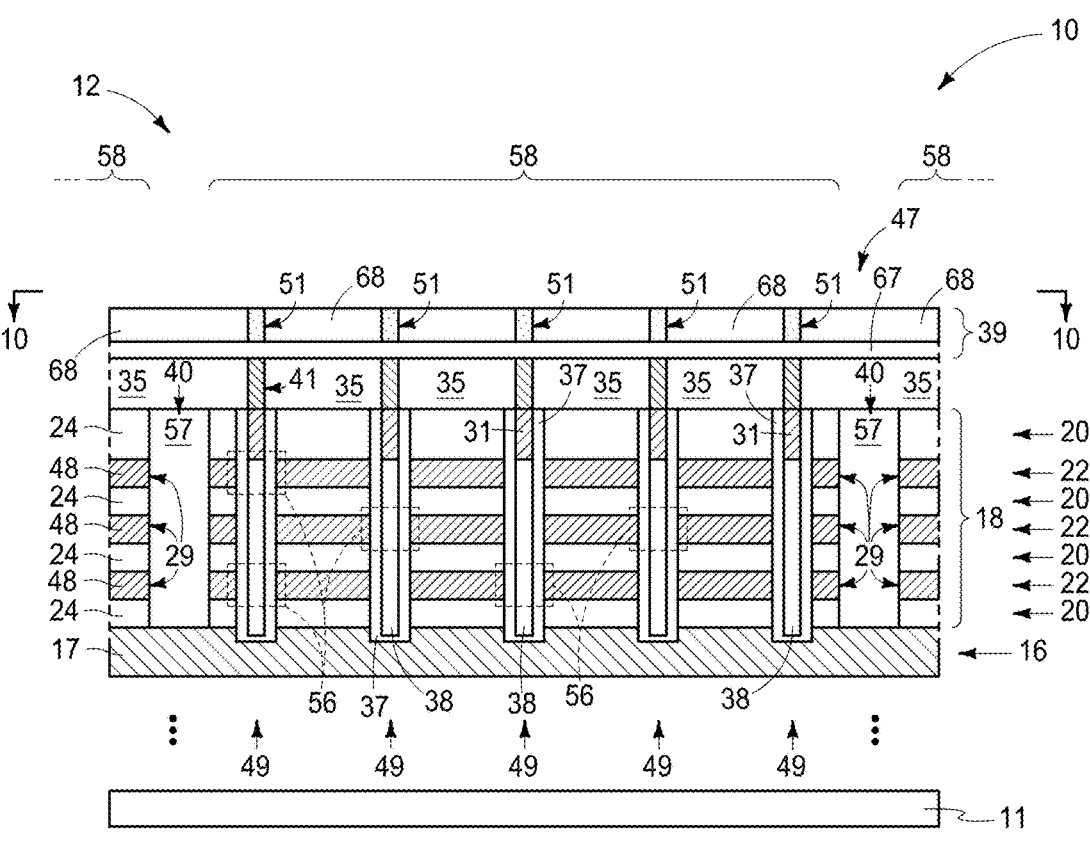
Figure 12:
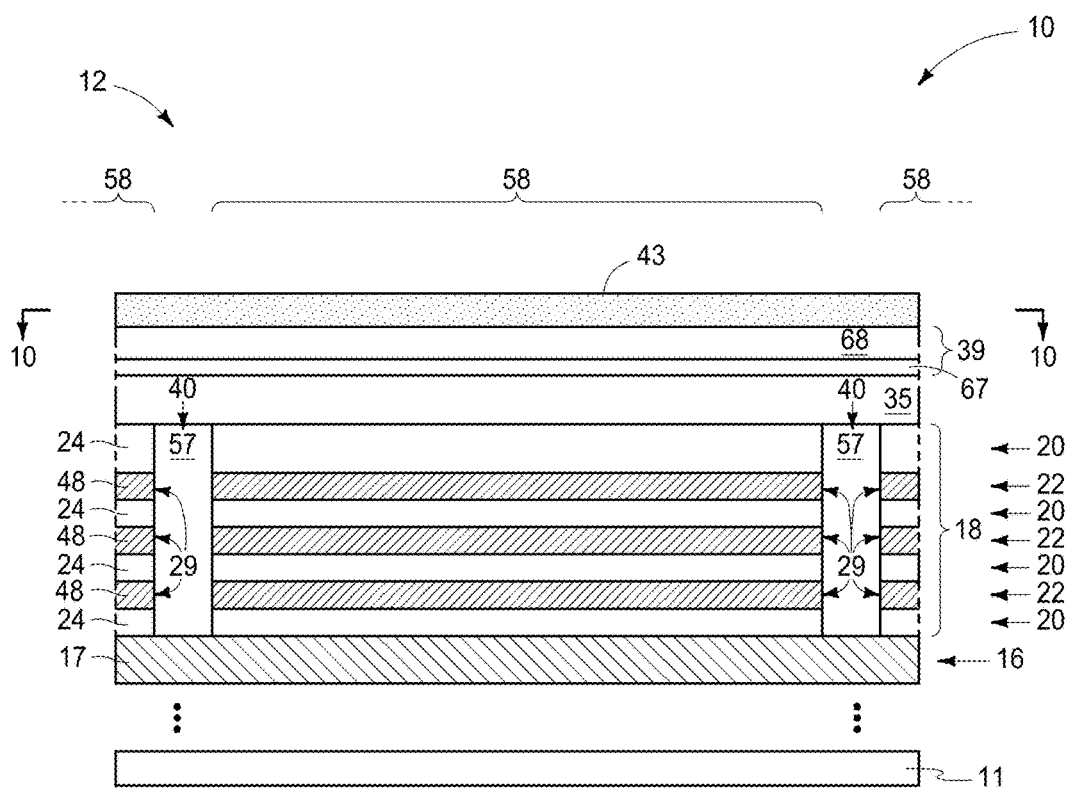
Figure 13:
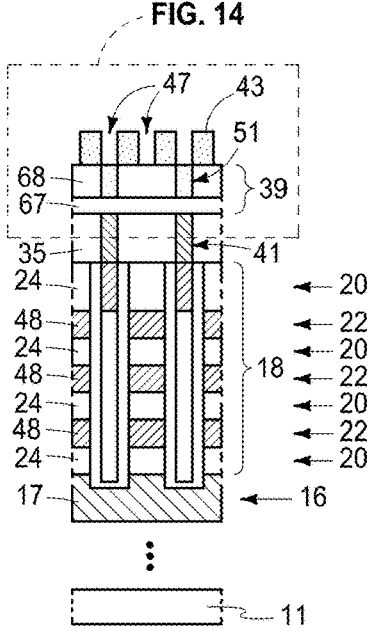
Figure 14:
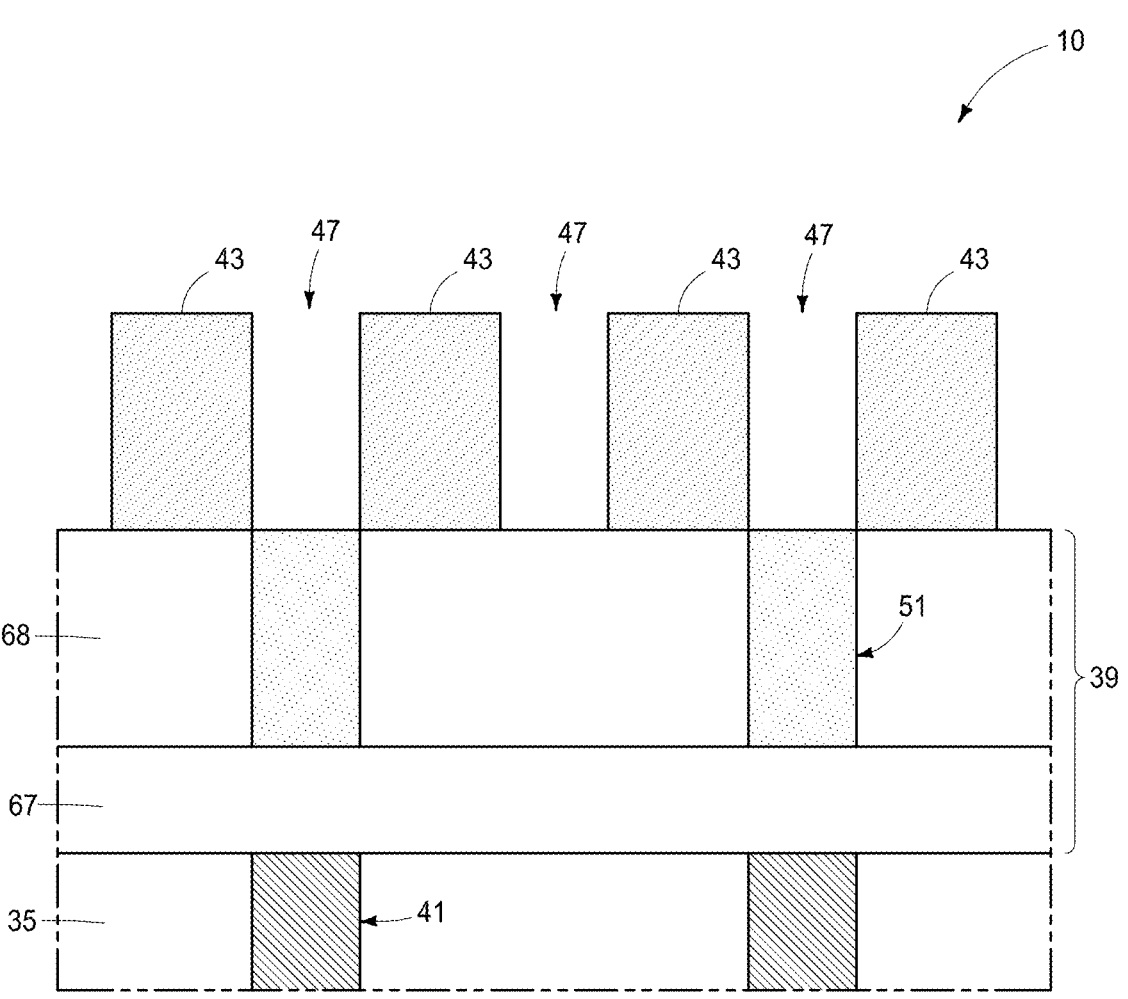

Referring to FIGS. 8 and 9, insulating material 39 has been formed directly above channel-material strings 53. In one embodiment, insulating material 39 comprises silicon nitride 68 above silicon dioxide 67. Example sacrificial plugs 51 (e.g., silicon dioxide) have been formed in insulating material 39 and are individually over/above different ones of channel-material strings 53. Sacrificial plugs 51 may taper laterally inward or laterally outward in the vertical cross-section that is FIG. 9 (not shown). By way of example only and for convenience, sacrificial plugs 51 are shown as being of the same horizontal size as, the same horizontal shape as, and perfectly aligned with individual conducting vias 41.

Referring to FIGS. 10-14, walls 43 have been formed above insulating material 39. Void space 47 is laterally-between immediately-adjacent walls 43, with such having a longitudinal outline (e.g., in a horizontal plane; e.g., that of FIG. 10) of individual digitlines to be formed. In one embodiment, walls 43 are sacrificial and in one embodiment contain carbon. In some embodiments, walls 43 contain at least 0.05 atomic percent carbon, contain no more than 20 atomic percent carbon, contain no more than 12 atomic percent carbon, contain at least 1 atomic percent carbon, contain at least 5 atomic percent carbon, consists essentially of carbon, and consists of carbon. Examples included diamond-like carbon, amorphous carbon, carbon-doped silicon dioxide, and carbon-doped silicon nitride. Pitch multiplication may be used in fabrication of any of the components herein.

Figure 15:
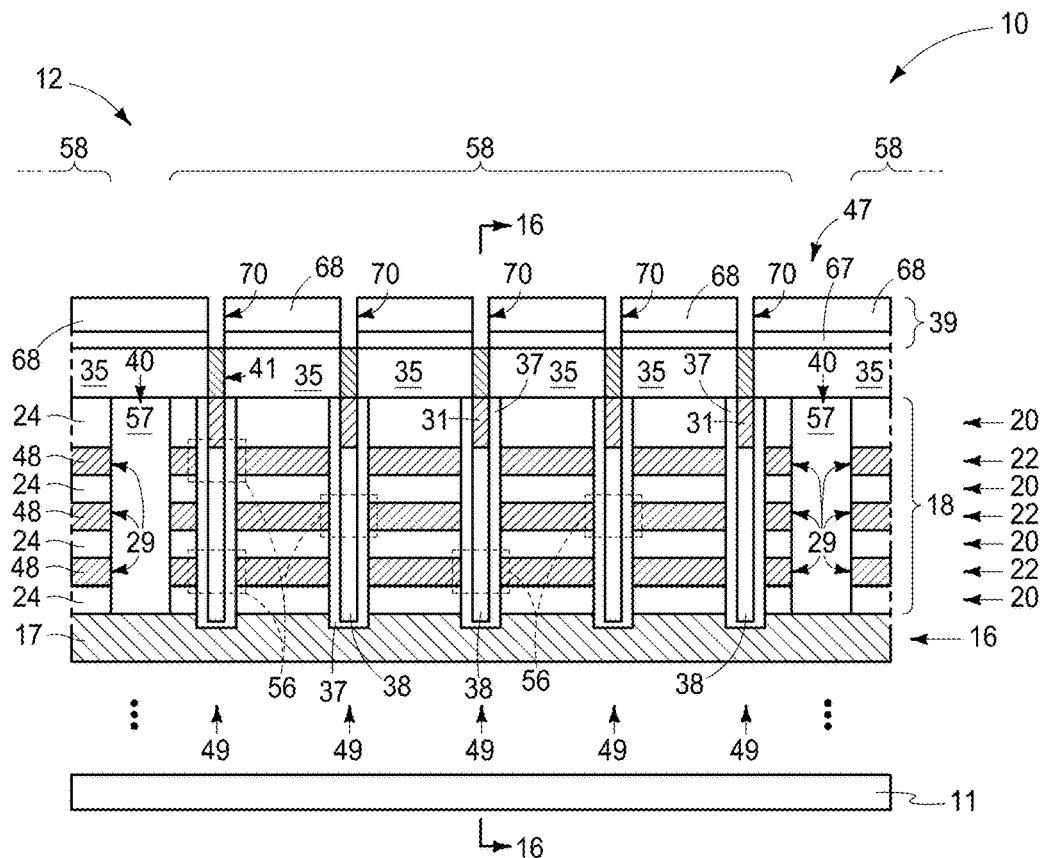
Figure 16:
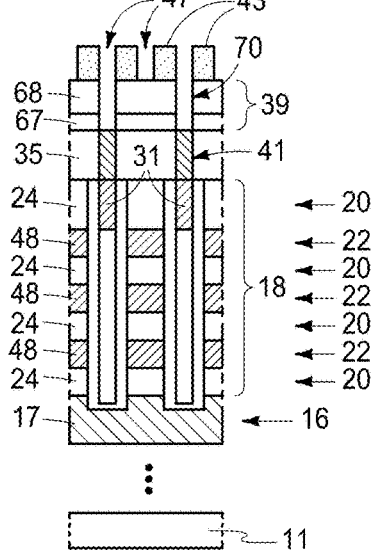

Referring to FIGS. 15 and 16, sacrificial plugs 51 (not shown) have been removed from surrounding insulating material 39, followed by using insulating material 39 and walls 43 as a mask while etching material 67 to expose conductive vias 41. Thereby, and in one embodiment, spaced openings 70 have been formed in insulating material 39 directly below void space 47.

Figure 17:
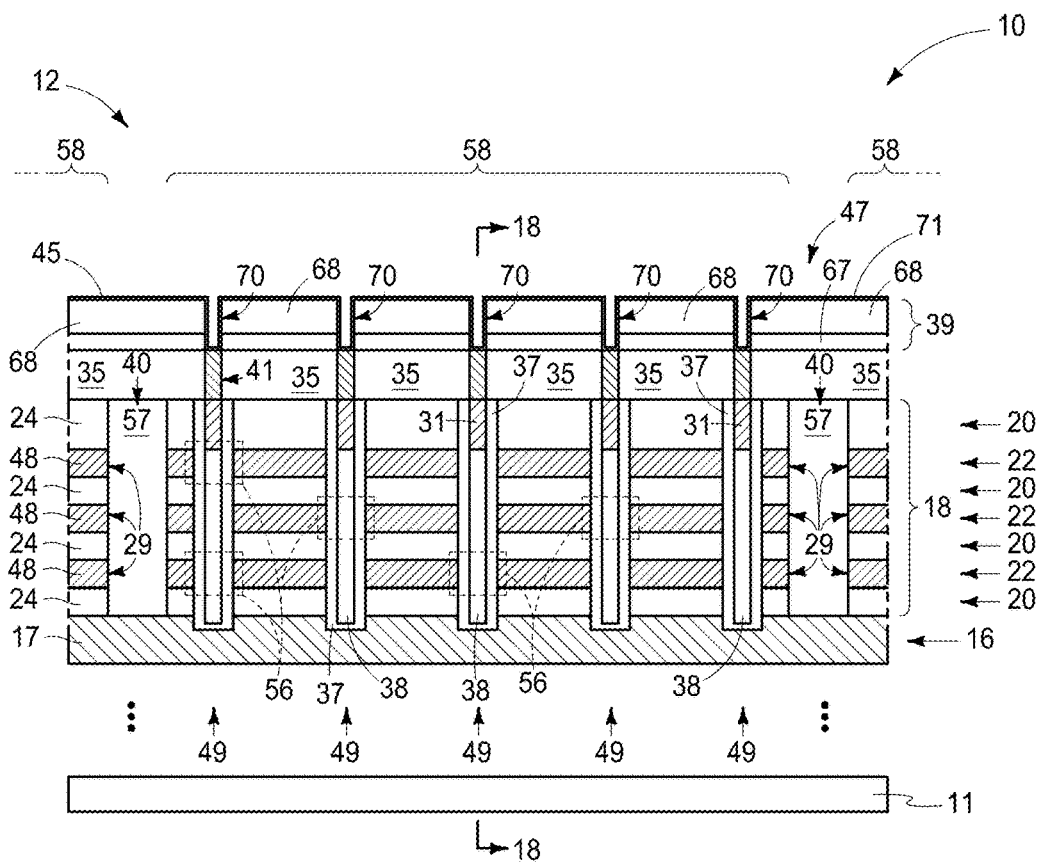
Figure 18:
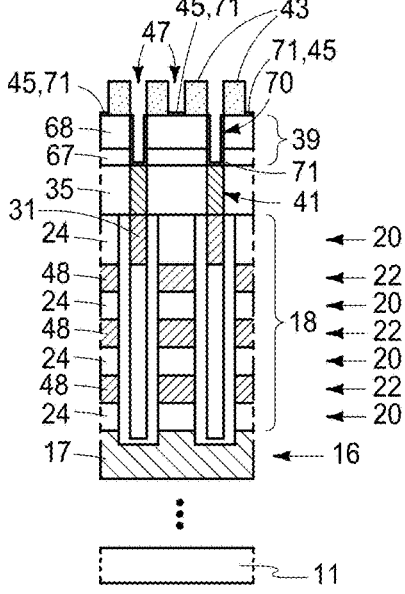
Figure 19:
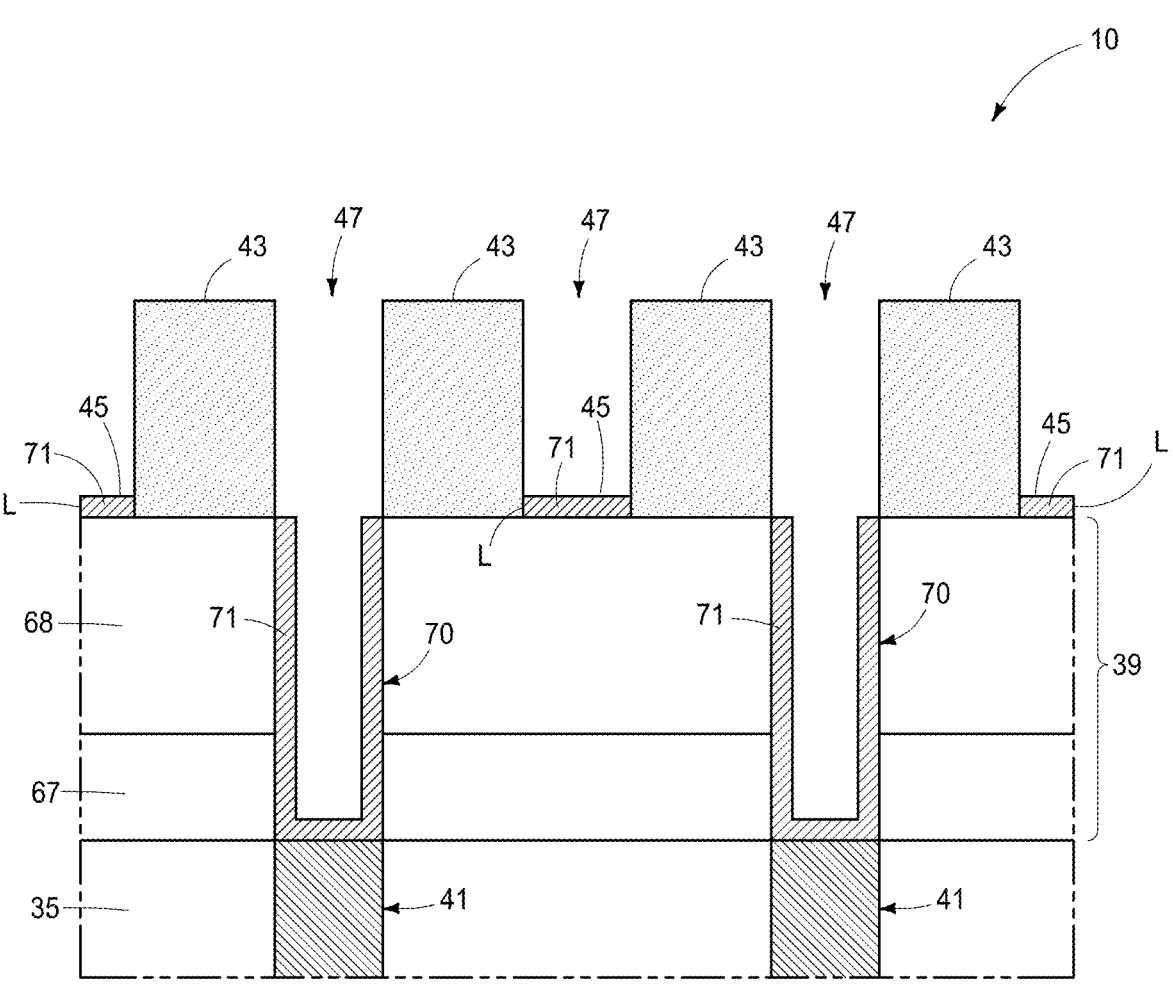
Figure 20:
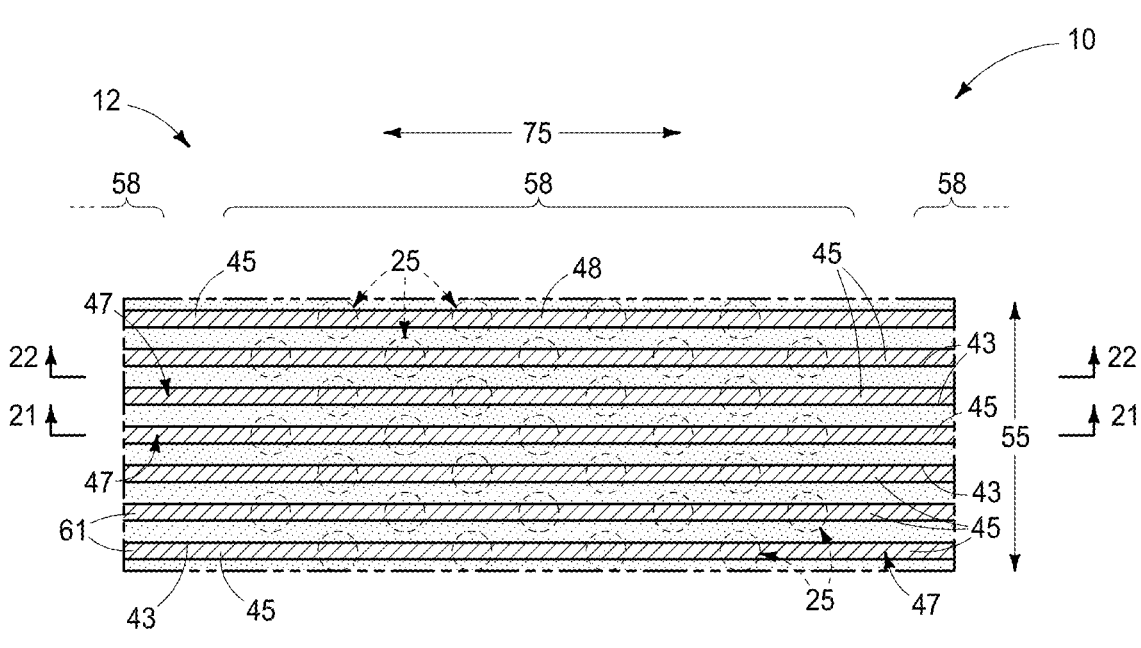
Figure 21:
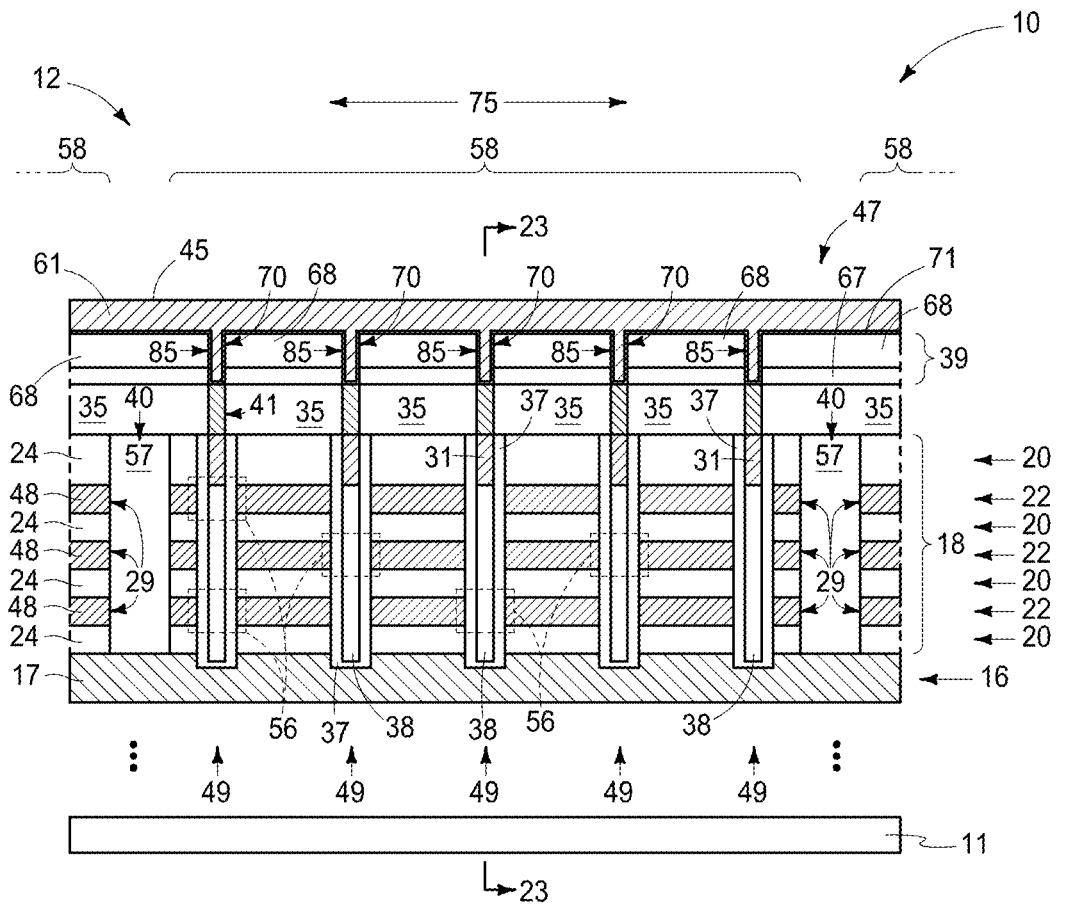
Figure 22:
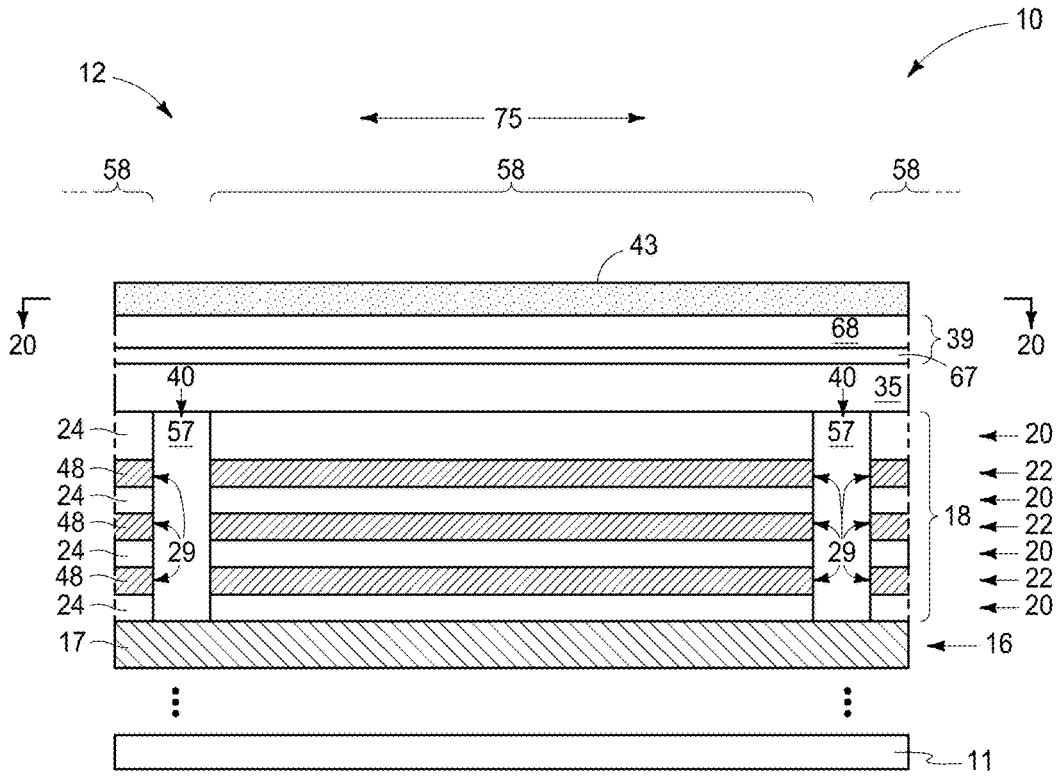
Figure 23:
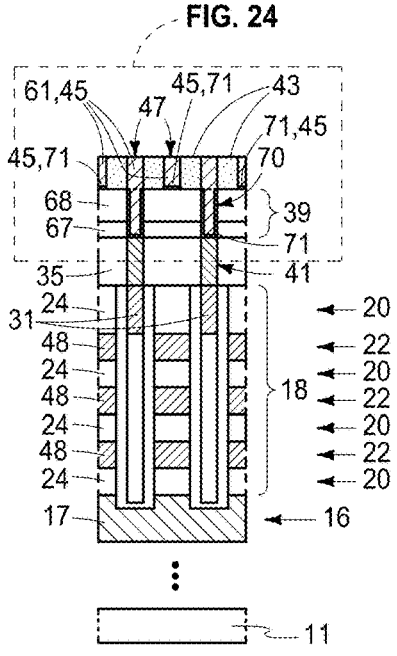

Referring to FIGS. 17-19, relative to walls 43, a conductive metal nitride 71 has been selectively deposited in void space 47, in the spaced openings 70, and atop insulating material 39 that is laterally-between walls 43 and spaced openings 70 to form lower portion L of individual digitlines laterally-between immediately-adjacent walls 43, with conductive metal nitride 71 that is in individual spaced openings 70 being directly electrically coupled to individual channel-material strings 53 (e.g., through vias 41 and material 31). Alternately considered, conductive metal nitride 71 is deposited in a manner that is selective (as defined herein) to not deposit on material of walls 43. By way of examples only, some conductive metal nitrides are a titanium nitride, a tungsten nitride, a tantalum nitride, and a ruthenium nitride. As an example, a conductive metal nitride can be selectively deposited to not deposit on a carbon-containing material by CVD using ammonia, a metal tetrachloride (e.g., titanium tetrachloride for titanium nitride), substrate temperature of 100° C. to 800° C., and pressure of 1 mTorr to 760 Torr. In one embodiment, conductive metal nitride 71 is deposited in spaced openings 70 to line sidewalls and a bottom of individual spaced openings 70 and to less-than-fill such openings 70. In one embodiment, conductive metal nitride 71 is deposited to form lower portion L to be longitudinally-continuous across and between spaced openings 70 (e.g., to form a complete lower portion L of what will be individual digitlines 45).

Referring to FIGS. 20-24, a conductive material 61 has been formed in void space 47 (e.g., non-selectively) directly above and directly electrically coupled to lower portion L (e.g., directly there-against) of individual digitlines 45 to form an upper portion U thereof (and in one embodiment complete formation of individual conductive vias 85 directly below digitlines 45). In one embodiment, conductive material 61 is of higher conductivity than that of conductive metal nitride 71 (e.g., comprising an elemental-from metal; e.g., elemental tungsten), in one embodiment is longitudinally-continuous across and between spaced openings 70, and in one embodiment is formed in spaced openings 70 (e.g., when conductive metal nitride less-than-fills spaced openings 70). In one embodiment, conductive metal nitride 71 in digitlines 45 is not along sidewalls of conductive material 61 between spaced openings 70. An example technique of forming conductive material 61 is to deposit such to over-fill remaining volume of void spaces 47, followed by planarizing such back at least to the top surfaces of walls 43. In one embodiment, conductive material 61 of digitlines 45 and conductive metal nitride 71 of digitlines 45 each have laterally-opposing edges (e.g., sidewalls; e.g., 80 and 82, respectively) between immediately-adjacent spaced openings 70 that are orthogonal a straight-line direction 75 between immediately-adjacent spaced openings 70. Laterally-opposing edges 80 of conductive material 61 and laterally-opposing edges 82 of conductive metal nitride 71 are laterally-coincident where most-proximate (adjacent) one another.

Referring to FIGS. 25-28, and in one embodiment, walls 43 (not shown) have been removed after forming upper portion U (e.g., by etching or ashing). Alternately, all or some of such may remain in a finished construction of the circuitry being formed (when insulative and not shown). FIGS. 29-33 show formation of insulative material 83 and void spaces 84 therein over digitlines 45.

Any other attribute(s) or aspect(s) as shown and/or described herein with respect to other embodiments may be used in the embodiments shown and described with reference to FIGS. 1-33.

Figure 34:
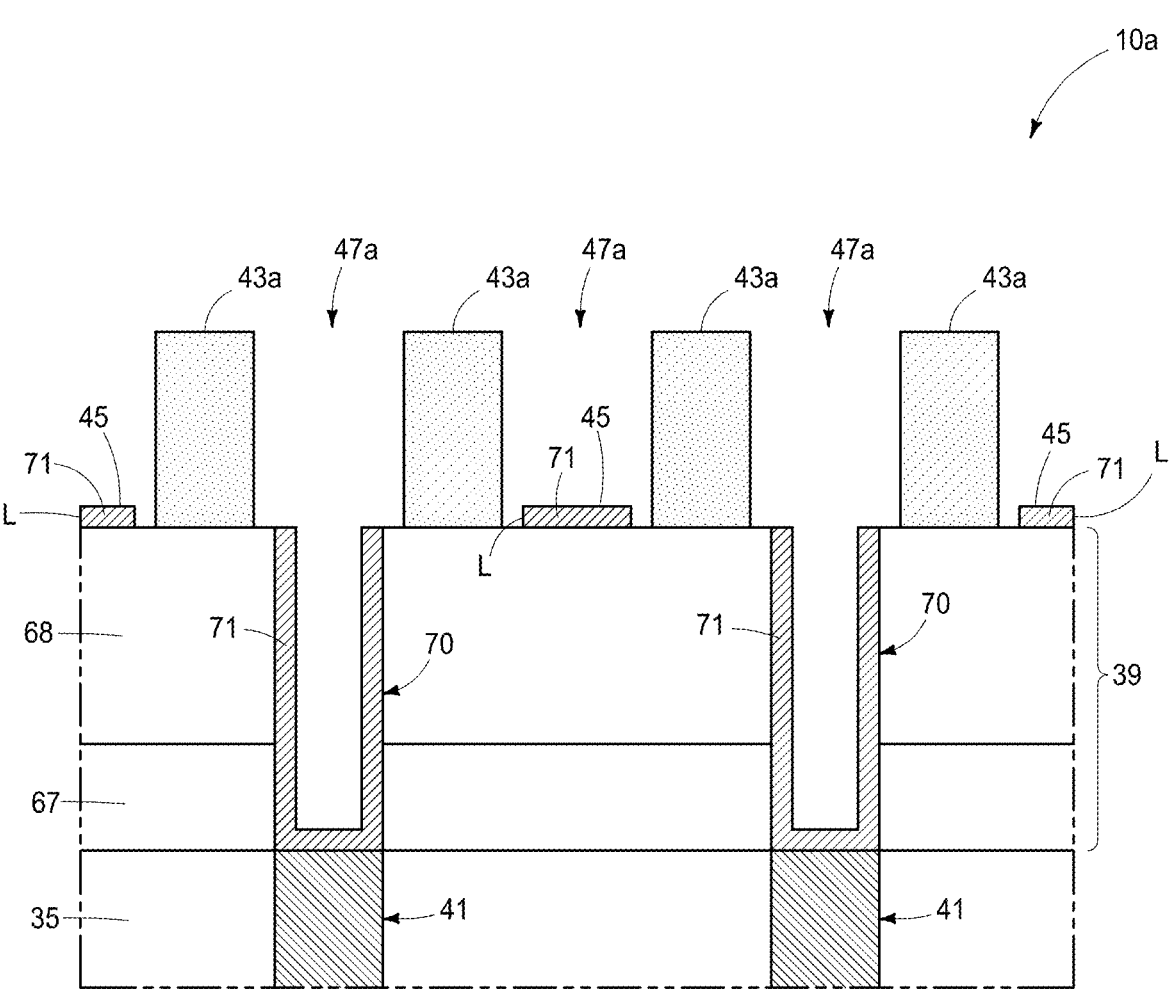

An alternate example method in accordance with embodiments of the invention is next described with reference to FIGS. 34-36 with respect to a construction 10a. Like numerals from the above-described embodiments have been used where appropriate, with some construction differences being indicated with the suffix "a" or with different numerals. FIG. 34 shows processing immediately-after that shown by FIG. 19 and before that shown by FIG. 24. Walls 43a are shown as having been laterally-trimmed (e.g., by etching) to form a widened void space 47a. In one embodiment and as shown, such has also reduced vertical thickness of the walls (e.g., when walls 43a are homogenous and the tops thereof are exposed during the lateral trimming).

Figure 24:
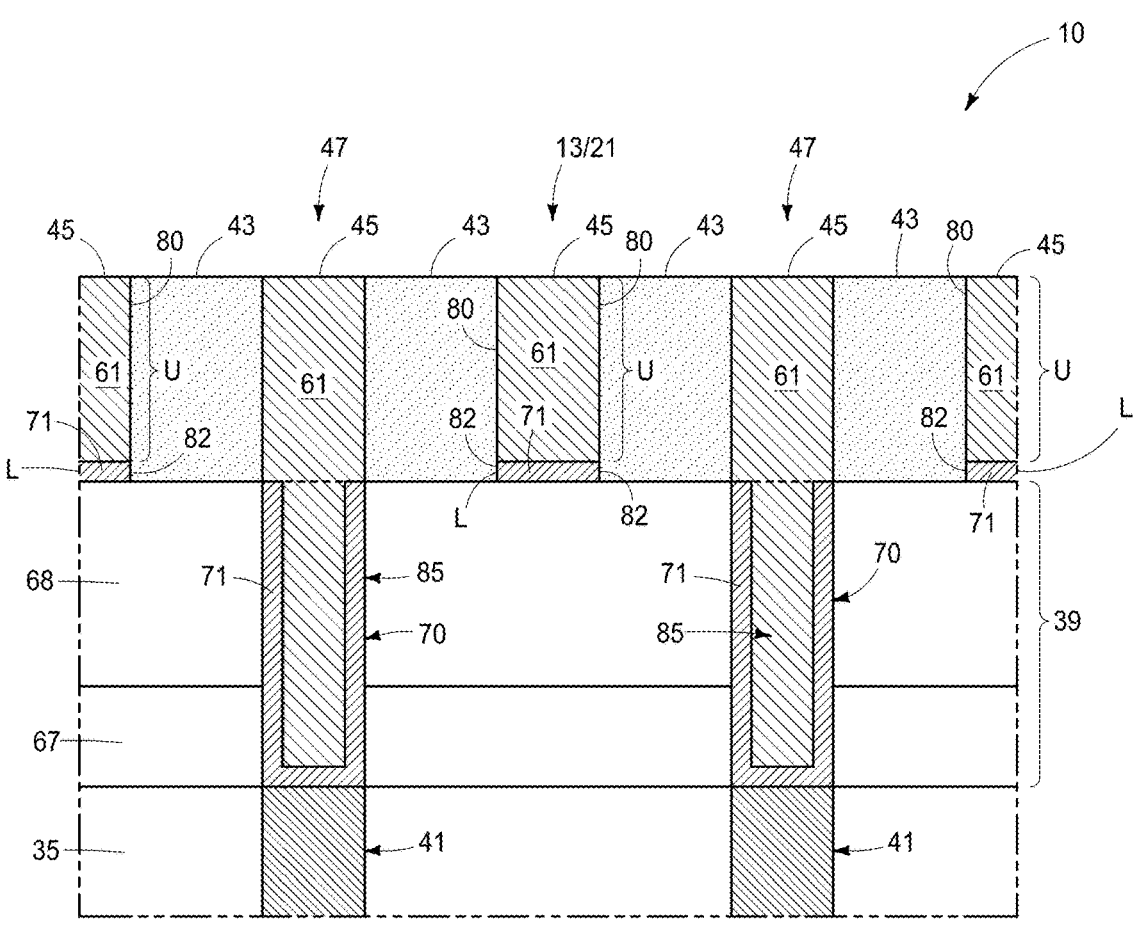
Figure 25:
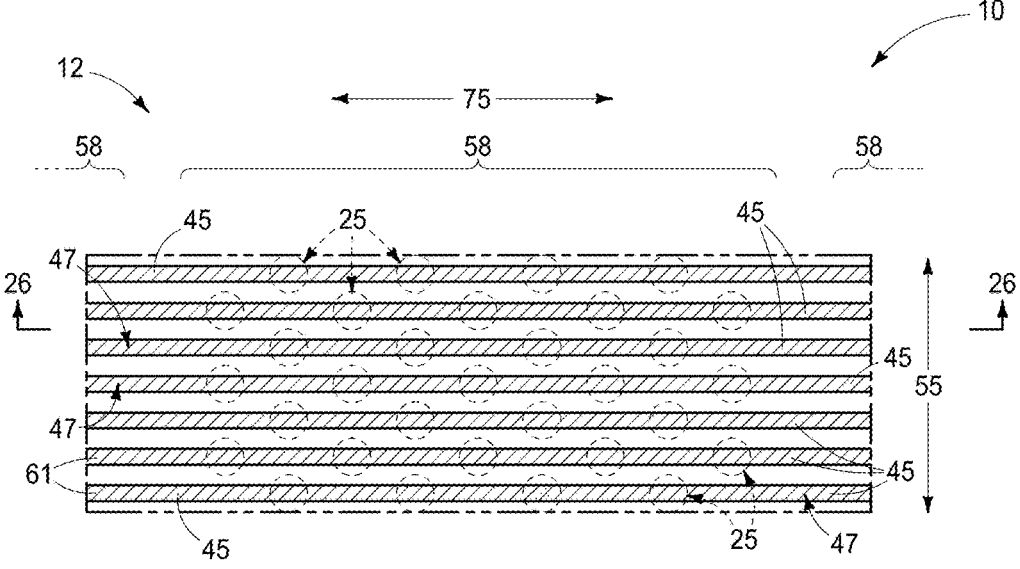
Figure 26:
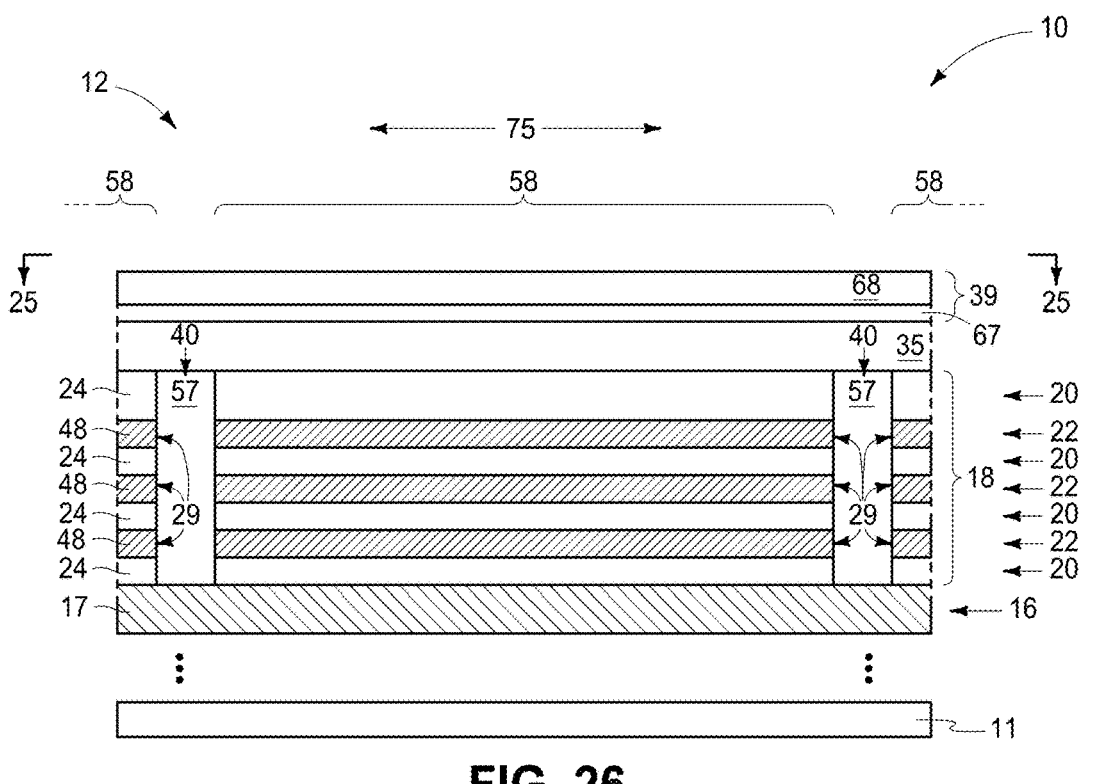
Figure 27:
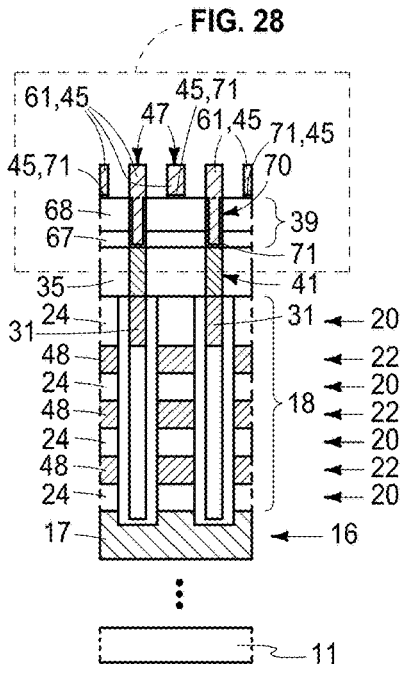
Figure 28:
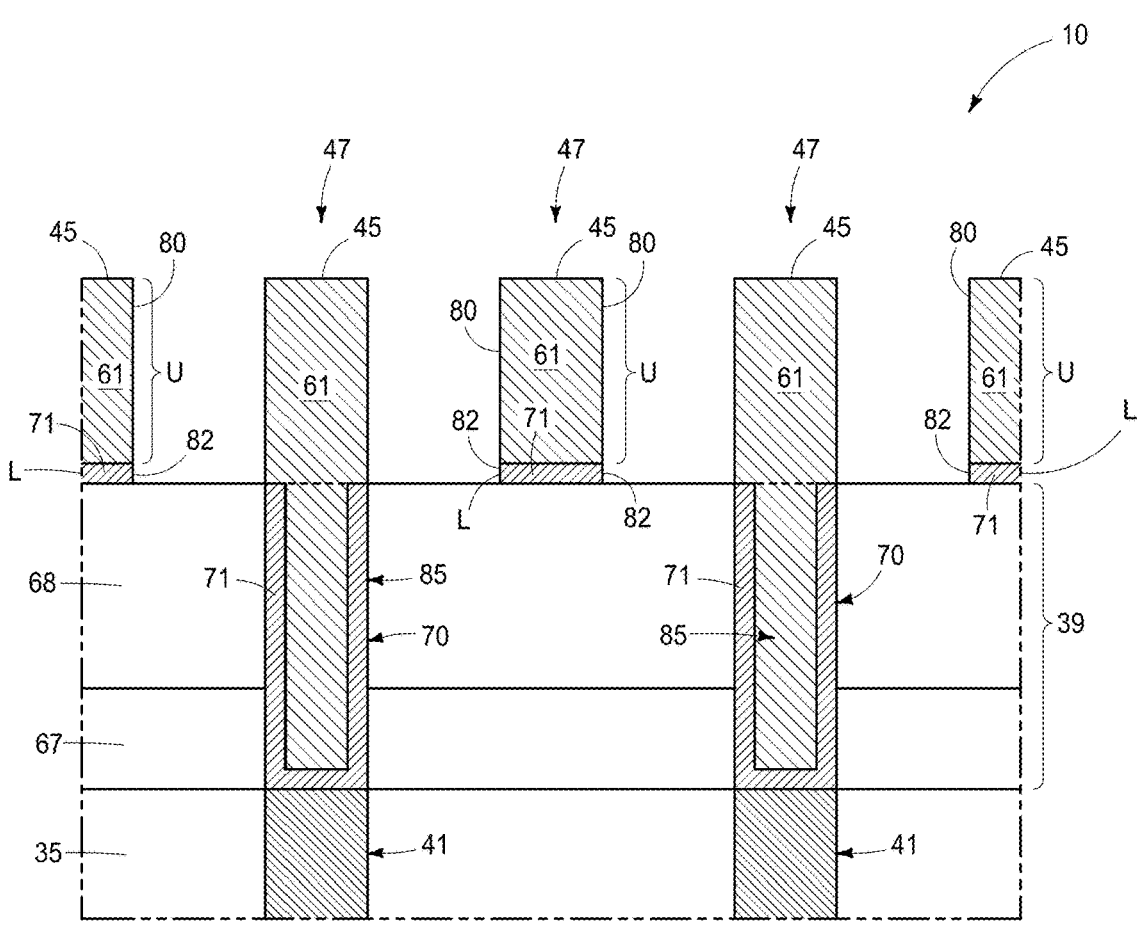
Figure 29:
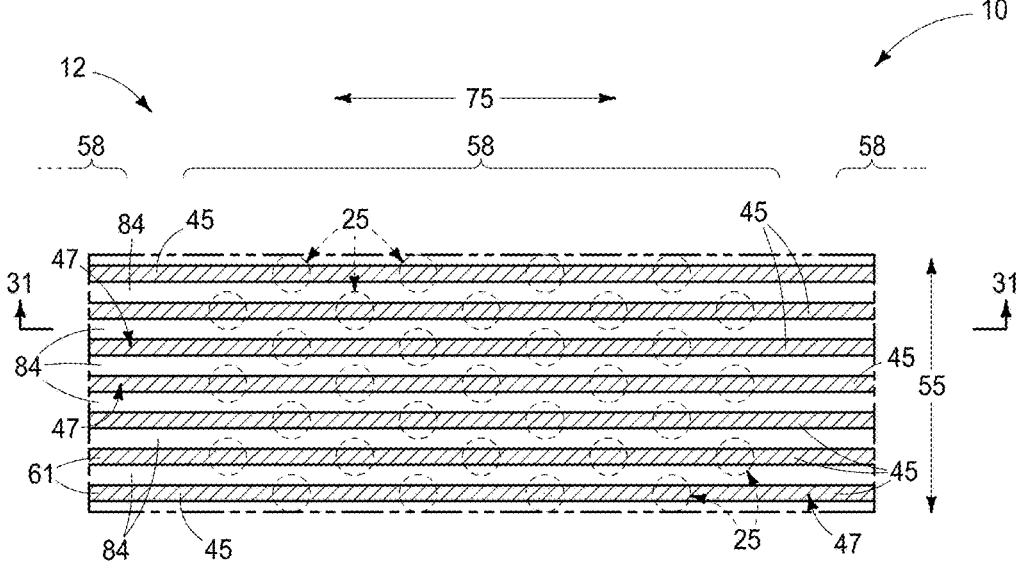
Figure 30:
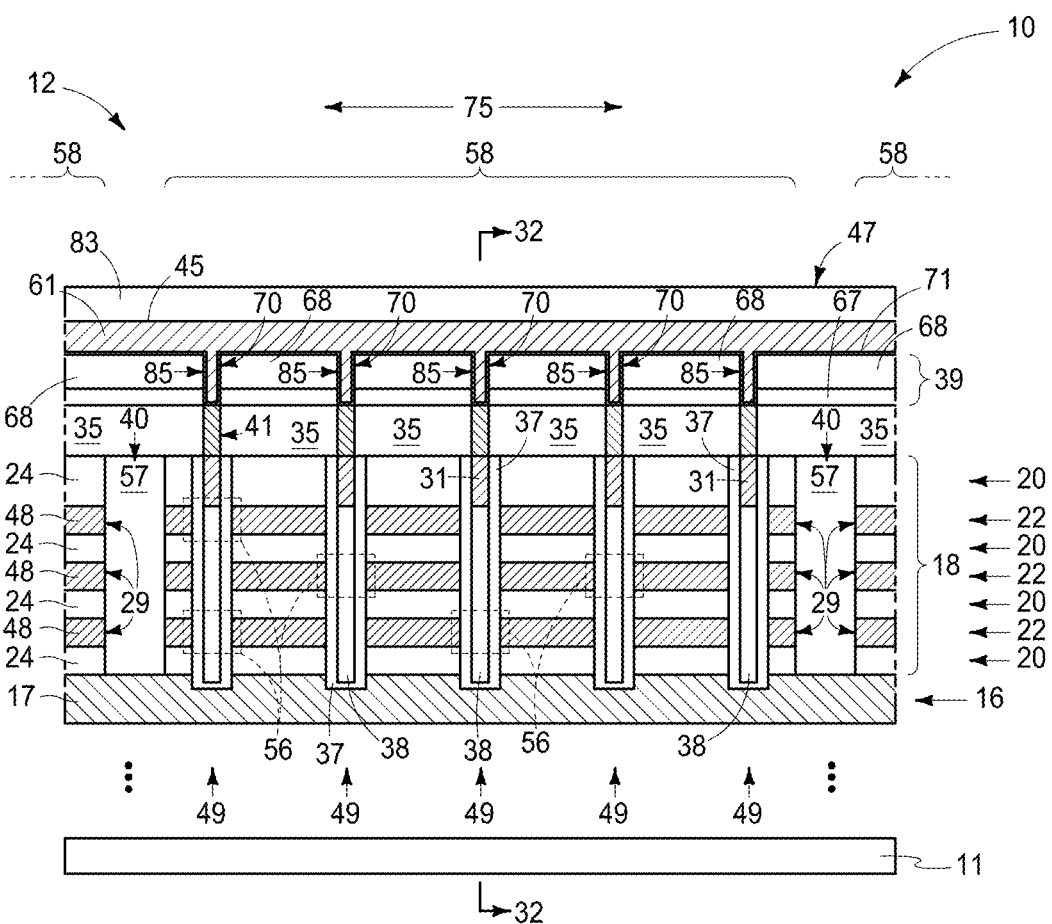
Figure 31:
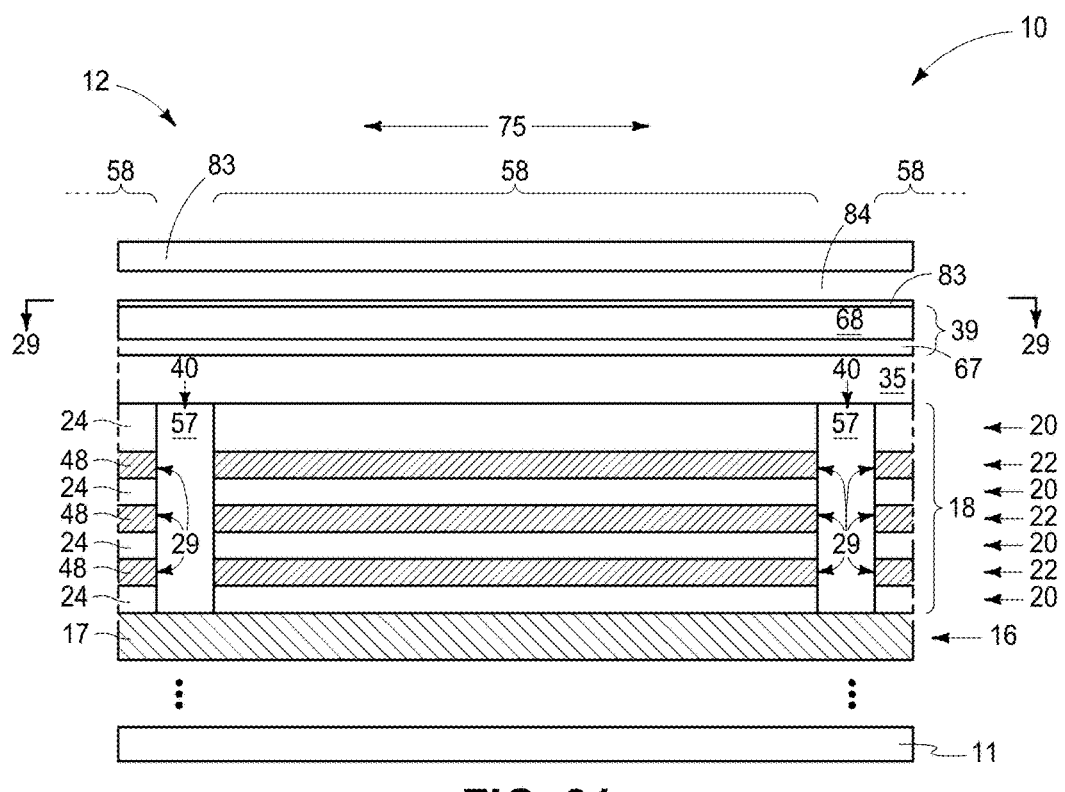
Figure 32:
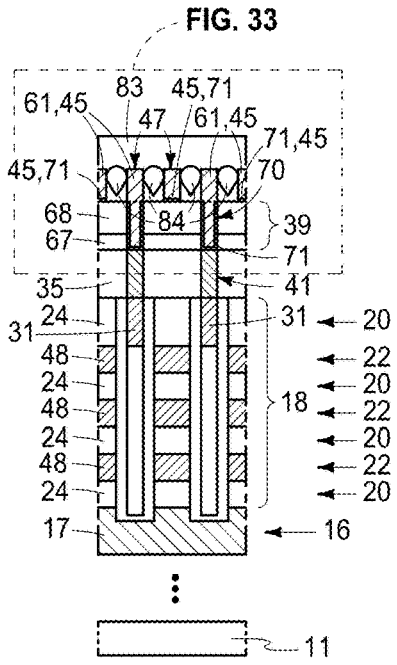
Figure 33:
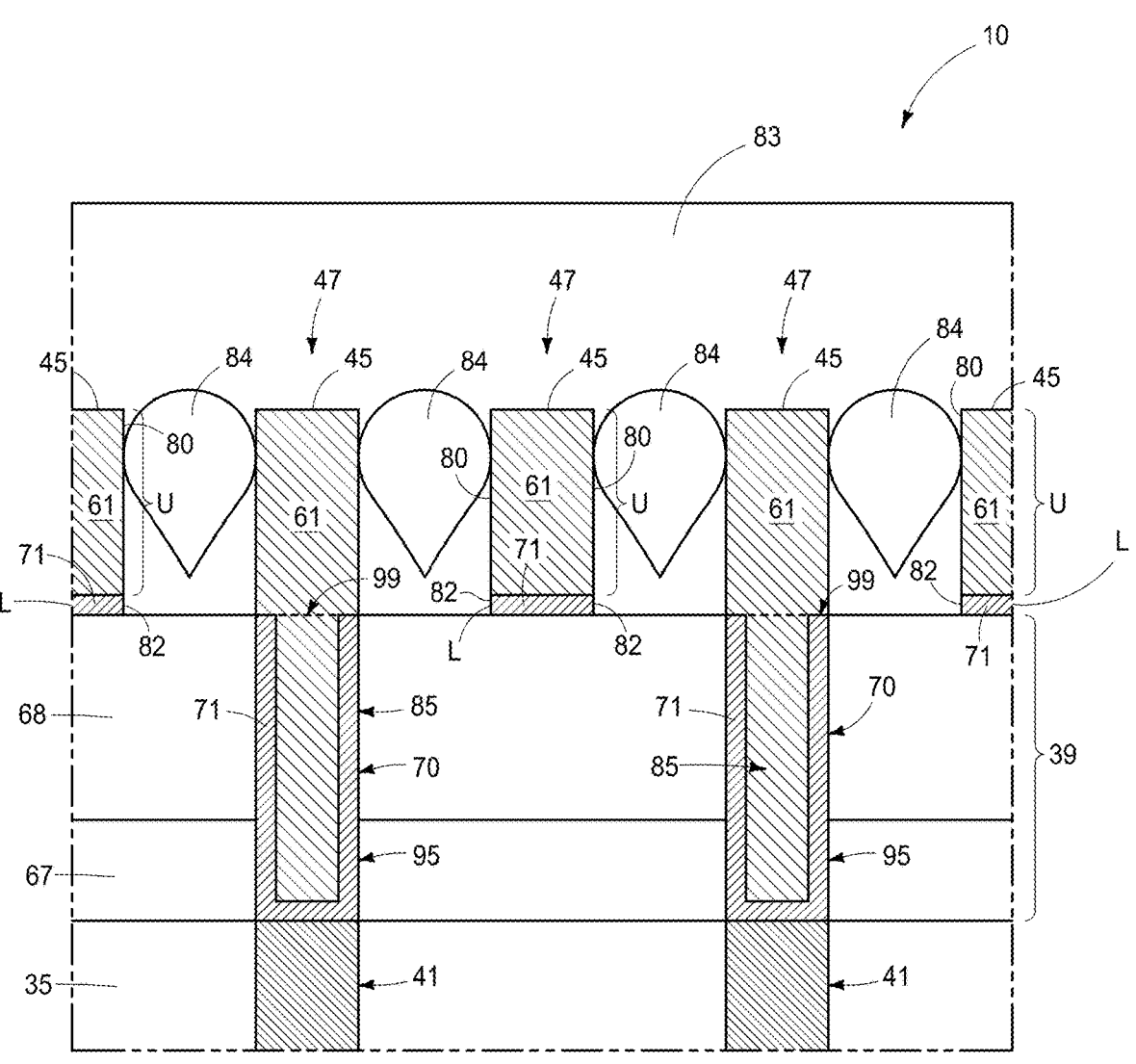
Figure 35:
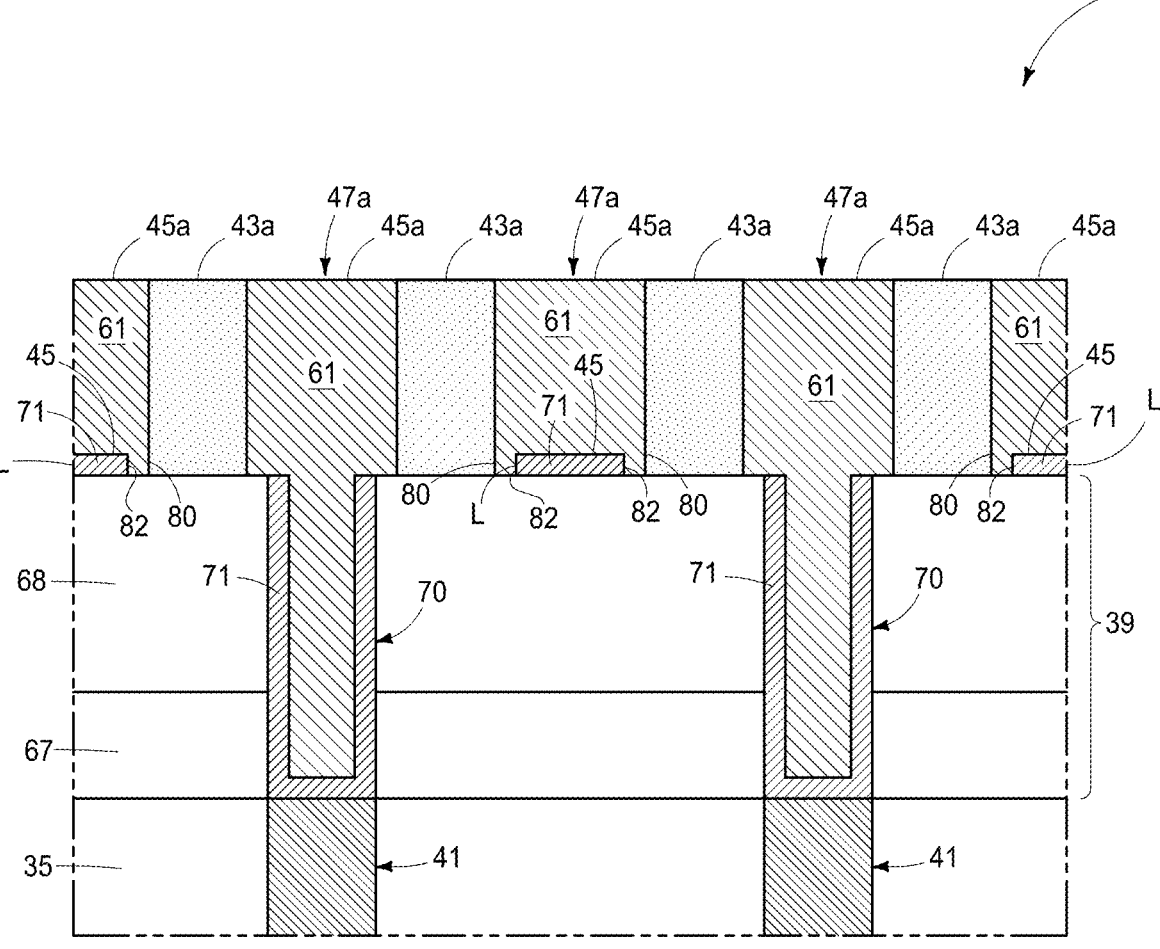
Figure 36:
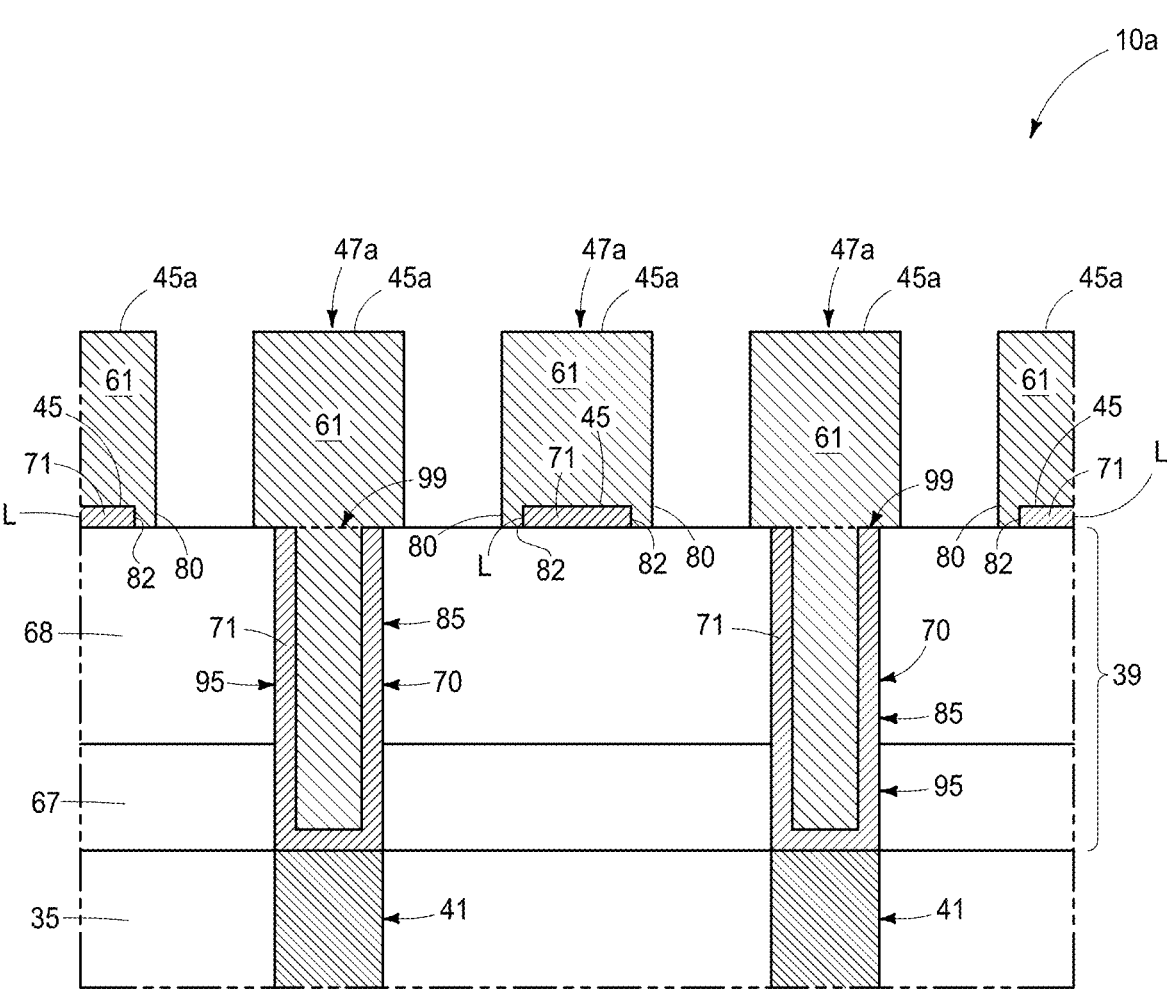

Referring to FIGS. 35 and 36, construction 10a has been subjected to subsequent processing analogous to that shown by FIGS. 24 and 28, respectively, with respect to construction 10. Yet in construction 10a, laterally-opposing edges 80 of conductive material being 61 are laterally-outward of laterally-opposing edges 82 of conductive metal nitride 71 where most-proximate one another.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises a stack (e.g., 18) comprising vertically-alternating insulative tiers (e.g., 20) and conductive tiers (e.g., 22). Channel-material strings (e.g., 53) of memory-cell strings (e.g., 49) extend through the insulative and conductive tiers. Digitlines (e.g., 45) are above and electrically coupled to the channel-material strings by conductive vias (e.g., 85 and 41 through material 31) that are individually above individual of the channel-material strings and below individual of the digitlines. The digitlines between tops (e.g., 99 in FIGS. 33 and 36) of the conductive vias comprise a conductive metal nitride (e.g., 71) directly below a conductive material (e.g., 61) of higher conductivity than that of the conductive metal nitride. The conductive metal nitride is not along sidewalls (e.g., 80) of the conductive material between the tops of the conductive vias. Any other attribute(s) or aspect(s) as shown and/or described herein with respect to other embodiments may be used.

In one embodiment, a memory array (e.g., 12) comprises a stack (e.g., 18) comprising vertically-alternating insulative tiers (e.g., 20) and conductive tiers (e.g., 22). Channel-material strings (e.g., 53) of memory-cell strings (e.g., 49) extend through the insulative and conductive tiers. Digitlines (e.g., 45) are above and electrically coupled to the channel-material strings by conductive vias (e.g., 85 and 41 through material 31) that are individually above individual of the channel-material strings and below individual of the digitlines. Upper portions of individual of the conductive vias comprise an upwardly-open container (e.g., 95 in FIGS. 33 and 36) comprising a conductive metal nitride (e.g., 71). The digitlines between tops (e.g., 99) of the upper portions of the conductive vias comprise the conductive metal nitride directly below a conductive material (e.g., 61) of higher conductivity than that of the conductive metal nitride. The conductive metal nitride is not along sidewalls (e.g., 80) of the conductive material between the tops of the upper portions of the conductive vias. The conductive material of the digitlines extends downwardly into the upwardly-open container of the upper portions of the individual conductive vias. Any other attribute(s) or aspect(s) as shown and/or described herein with respect to other embodiments may be used.

Processing and structure as described herein may enable use of a lower quantity of a less-conductive conductive metal nitride material 71 compared to a higher conducting conductive material 61 when such comprise such different conductivities. Where pitch quadrupling and carbon-containing walls are used, the digitlines may be formed directly within carbon-containing walls formed by a pitch-quadrupled process rather than having to etch a pitch-quadrupled feature into a second material and which may improve digitline uniformity. When using walls consisting of or consisting essentially of carbon, digitline critical-dimension might be better controlled by laterally trimming carbon. Airgaps may be easier or more quickly formed when using walls consisting of or consisting essentially of carbon which may not impact the digitlines as may otherwise occur by etching an airgap post-digitline formation which can consume the digitline itself and thereby increase digitline resistance. When using walls consisting of or consisting essentially of carbon, such may be easier to remove than, for example, silicon dioxide walls and may better define digitline height allowing taller digitlines.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend (ing) elevationally" refer to a direction that is angled away by at least 45° from exactly horizontal. Further, "extend (ing) elevationally", "elevationally-extending", "extend (ing) horizontally", "horizontally-extending" and the like with respect to a field effect transistor are with reference to orientation of the transistor's channel length along which current flows in operation between the source/drain regions. For bipolar junction transistors, "extend (ing) elevationally" "elevationally-extending", "extend (ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating insulative tiers and conductive tiers having channel-material strings therein. Walls are formed above insulating material that is directly above the channel-material strings. Void space is laterally-between immediately-adjacent of the walls and that comprises a longitudinal outline of individual digitlines to be formed. Spaced openings are in the insulating material directly below the void space. Relative to the walls, a conductive metal nitride is selectively deposited in the void space, in the spaced openings, and atop the insulating material laterally-between the walls and the spaced openings to form a lower portion of the individual digitlines laterally-between the immediately-adjacent walls. The conductive metal nitride that is in individual of the spaced openings is directly electrically coupled to individual of the channel-material strings. A conductive material is formed in the void space directly above and directly electrically coupled to the lower portion of the individual digitlines to form an upper portion thereof.

In some embodiments, a method used in forming a memory array comprising strings of memory cells comprises forming a stack comprising vertically-alternating insulative tiers and conductive tiers having channel-material strings therein. Carbon-containing sacrificial walls are formed above insulating material that is directly above the channel-material strings. Void space is laterally-between immediately-adjacent of the carbon-containing sacrificial walls and that comprises a longitudinal outline of individual digitlines to be formed. Spaced openings are in the insulating material directly below the void space. Relative to the carbon-containing sacrificial walls, a conductive metal nitride is selectively deposited in the void space, in the spaced openings to line sidewalls and a bottom of individual of the spaced openings and less-than-fills the individual spaced openings, and is atop the insulating material laterally-between the carbon-containing sacrificial walls and the spaced openings to form a longitudinally-continuous lower portion of the individual digitlines across and between the spaced openings. The conductive metal nitride that is in the individual spaced openings is directly electrically coupled to individual of the channel-material strings. A conductive material of higher conductivity than that of the conductive metal nitride is formed in the void space directly above and directly against the lower portion of the individual digitlines to form an upper portion thereof that is longitudinally-continuous across and between the spaced openings. The carbon-containing sacrificial walls are removed after forming the upper portion.

In some embodiments, a memory array comprises a stack comprising vertically-alternating insulative tiers and conductive tiers. Channel-material strings of memory-cell strings extend through the insulative and conductive tiers. Digitlines are above and electrically coupled to the channel-material strings by conductive vias that are individually above individual of the channel-material strings and below individual of the digitlines. The digitlines between tops of the conductive vias comprise a conductive metal nitride directly below a conductive material of higher conductivity than that of the conductive metal nitride. The conductive metal nitride is not along sidewalls of the conductive material between the tops of the conductive vias.

In some embodiments, a memory array comprises a stack comprising vertically-alternating insulative tiers and conductive tiers. Channel-material strings of memory-cell strings extend through the insulative and conductive tiers. Digitlines are above and electrically coupled to the channel-material strings by conductive vias that are individually above individual of the channel-material strings and below individual of the digitlines. Upper portions of individual of the conductive vias comprise an upwardly-open container comprising a conductive metal nitride. The digitlines between tops of the upper portions of the conductive vias comprise the conductive metal nitride directly below a conductive material of higher conductivity than that of the conductive metal nitride. The conductive metal nitride is not along sidewalls of the conductive material between the tops of the upper portions of the conductive vias. The conductive material of the digitlines extends downwardly into the upwardly-open container of the upper portions of the individual conductive vias.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A memory array comprising:
a stack comprising vertically-alternating insulative tiers and conductive tiers, channel-material strings of memory-cell strings extending through the insulative and conductive tiers;

digitlines above and electrically coupled to the channel-material strings by conductive vias that are individually above individual of the channel-material strings and below individual of the digitlines;

the digitlines between top surfaces of the conductive vias comprising a conductive metal nitride directly below a conductive material of higher conductivity than that of the conductive metal nitride, the conductive metal nitride not being disposed along sidewalls of the conductive material between the top surfaces of the conductive vias; and insulative material between the digitlines that are next to one another, the insulative material including a void space that is between the digitlines that are next to one another.

2. The memory array of claim 1 wherein the void space is narrower at its bottom than at its top.

3. The memory array of claim 1 wherein the void space extends upwardly to have a top that is higher than top surfaces of the digitlines that are next to one another.

4. The memory array of claim 1 wherein the void space has a bottom that is higher than the top surfaces of the conductive vias.

5. The memory array of claim 1 wherein,
the void space is narrower at its bottom than at its top; and
the top of the void space is higher than top surfaces of the digitlines that are next to one another.

6. The memory array of claim 1 wherein,
the void space is narrower at its bottom than at its top; and
the bottom of the void space is higher than the top surfaces of the conductive vias.

7. The memory array of claim 1 wherein,
the void space extends upwardly to have a top that is higher than top surfaces of the digitlines that are next to one another; and
the void space has a bottom that is higher than the top surfaces of the conductive vias.

8. The memory array of claim 1 wherein,
the void space is narrower at its bottom than at its top;
the top of the void space is higher than top surfaces of the digitlines that are next to one another; and
the bottom of the void space is higher than the top surfaces of the conductive vias.

9. A memory array comprising:
a stack comprising vertically-alternating insulative tiers and conductive tiers, channel-material strings of memory-cell strings extending through the insulative and conductive tiers;

digitlines above and electrically coupled to the channel-material strings by conductive vias that are individually above individual of the channel-material strings and below individual of the digitlines;

upper portions of individual of the conductive vias comprising an upwardly-open container comprising a conductive metal nitride;

the digitlines between top surfaces of the upper portions of the conductive vias comprising the conductive metal nitride directly below a conductive material of higher conductivity than that of the conductive metal nitride, the conductive metal nitride not being disposed along sidewalls of the conductive material between the top surfaces of the upper portions of the conductive vias, said conductive material of the digitlines extending downwardly into the upwardly-open container of the upper portions of the individual conductive vias; and insulative material between the digitlines that are next to one another, the insulative material including a void space that is between the digitlines that are next to one another.

10. The memory array of claim 9 wherein the void space is narrower at its bottom than at its top.

11. The memory array of claim 9 wherein the void space extends upwardly to have a top that is higher than top surfaces of the digitlines that are next to one another.

12. The memory array of claim 9 wherein the void space has a bottom that is higher than the top surfaces of the conductive vias.

13. The memory array of claim 9 wherein,
the void space is narrower at its bottom than at its top; and
the top of the void space is higher than top surfaces of the digitlines that are next to one another.

14. The memory array of claim 9 wherein,
the void space is narrower at its bottom than at its top; and
the bottom of the void space is higher than the top surfaces of the conductive vias.

15. The memory array of claim 9 wherein,
the void space extends upwardly to have a top that is higher than top surfaces of the digitlines that are next to one another; and
the void space has a bottom that is higher than the top surfaces of the conductive vias.

16. The memory array of claim 9 wherein,
the void space is narrower at its bottom than at its top;
the top of the void space is higher than top surfaces of the digitlines that are next to one another; and
the bottom of the void space is higher than the top surfaces of the conductive vias.

17. A memory array comprising:
a stack comprising vertically-alternating insulative tiers and conductive tiers, channel-material strings of memory-cell strings extending through the insulative and conductive tiers;

digitlines above and electrically coupled to the channel-material strings by conductive vias that are individually above individual of the channel-material strings and below individual of the digitlines;

the digitlines between top surfaces of the conductive vias comprising a conductive metal nitride directly below a conductive material of higher conductivity than that of the conductive metal nitride, the conductive metal nitride not being disposed along sidewalls of the conductive material between the top surfaces of the conductive vias; and insulative material between the digitlines that are next to one another, the insulative material including a void space that is between the digitlines that are next to one another.

18. The memory array of claim 17 wherein the void space is narrower at its bottom than at its top.

19. The memory array of claim 17 wherein the void space extends upwardly to have a top that is higher than top surfaces of the digitlines that are next to one another.

20. The memory array of claim 17 wherein the void space has a bottom that is higher than the top surfaces of the conductive vias.

21. The memory array of claim 17 wherein,
the void space is narrower at its bottom than at its top; and
the top of the void space is higher than top surfaces of the digitlines that are next to one another.

22. The memory array of claim 17 wherein, the void space is narrower at its bottom than at its top; and the bottom of the void space is higher than the top surfaces of the conductive vias.

23. The memory array of claim 17 wherein, the void space extends upwardly to have a top that is higher than top surfaces of the digitlines that are next to one another; and the void space has a bottom that is higher than the top surfaces of the conductive vias.

24. The memory array of claim 17 wherein, the void space is narrower at its bottom than at its top;

the top of the void space is higher than top surfaces of the digitlines that are next to one another; and the bottom of the void space is higher than the top surfaces of the conductive vias.

\* \* \* \* \*